United States Patent
Okamura et al.

(10) Patent No.: US 8,429,503 B2
(45) Date of Patent: Apr. 23, 2013

(54) ENCODING DEVICE AND DECODING DEVICE

(75) Inventors: Shutai Okamura, Osaka (JP); Masayuki Orihashi, Kanagawa (JP); Atsushi Sumasu, Kanagawa (JP)

(73) Assignee: Panasonic Corporation, Osaka (JP)

( * ) Notice: Subject to any disclaimer, the term of this patent is extended or adjusted under 35 U.S.C. 154(b) by 277 days.

(21) Appl. No.: 12/671,188

(22) PCT Filed: Jul. 29, 2008

(86) PCT No.: PCT/JP2008/002021
§ 371 (c)(1),
(2), (4) Date: Jan. 28, 2010

(87) PCT Pub. No.: WO2009/016825

PCT Pub. Date: Feb. 5, 2009

(65) Prior Publication Data
US 2010/0218066 A1 Aug. 26, 2010

(30) Foreign Application Priority Data

Jul. 30, 2007 (JP) .................................. 2007-197939
Jul. 28, 2008 (JP) .................................. 2008-193615

(51) Int. Cl.
*H03M 13/00* (2006.01)

(52) U.S. Cl.
USPC ........................................................ 714/776

(58) Field of Classification Search .................. 714/758, 714/776
See application file for complete search history.

(56) References Cited

U.S. PATENT DOCUMENTS

| 6,061,820 | A | * | 5/2000 | Nakakita et al. | ............... 714/751 |
| 7,668,248 | B2 | * | 2/2010 | Hocevar | ........................ 375/260 |
| 7,734,988 | B2 | * | 6/2010 | Kim et al. | ..................... 714/774 |
| 2004/0194007 | A1 | * | 9/2004 | Hocevar | ........................ 714/801 |
| 2007/0011570 | A1 | * | 1/2007 | Jeong et al. | .................... 714/758 |
| 2007/0086539 | A1 | * | 4/2007 | Hocevar | ........................ 375/267 |
| 2007/0101243 | A1 | * | 5/2007 | Kim et al. | ..................... 714/790 |
| 2007/0260772 | A1 | * | 11/2007 | Garmonov et al. | ............. 710/33 |

FOREIGN PATENT DOCUMENTS

| JP | 08-186570 | 7/1996 |
| JP | 2006-094012 | 4/2006 |

OTHER PUBLICATIONS

European Office Action dated Nov. 8, 2011.
Y. Han, et al., "Packet-LDPC Codes for Tape Drives," IEEE Transactions on Magnetics, vol. 44, No. 4, XP011130422, Apr. 1, 2005, pp. 1340-1347.

(Continued)

*Primary Examiner* — Yolanda L Wilson
(74) *Attorney, Agent, or Firm* — Dickinson Wright PLLC

(57) ABSTRACT

Disclosed are an encoding device and a decoding device which can effectively reduce the decoding failure frequency in LDPC encoding/decoding. A loss correction encoding device (120) includes a padding unit (121) which adds a padding packet to an information packet sequence; an interleave unit (122) which rearranges the padding packet and the information packet; and a loss correction encoding unit (123) which performs loss correction encoding for the packet string after the interleave. The interleave unit (122) rearranges the padding packet and the information packet according to variable nodes constituting a minimum stopping set of the inspection matrix which defines a low-density parity inspection code. The interleave unit (122) uses such a rearrangement pattern that avoids a loss correction failure by the minimum stopping set of the LDPC inspection matrix so as to reduce the probability of the loss correction failure by the minimum stopping set.

8 Claims, 34 Drawing Sheets

OTHER PUBLICATIONS

Y. Han, et al., "Dual-Mode Decoding of Product Codes with Application to Tape Storage," Global Telecommunications Conference 2005, vol. 3, XP010880927, Nov. 28, 2005, pp. 1255-1260.

T. Richardson, "Error Floors of LDPC Codes," Proceedings of the Forty-First Annual Allerton Conference on Communication, Control, and Computing, XP002587408, Oct. 1, 2003, pp. 1426-1435.

H. Song, et al., "Iterative Codes in Magnetic Storage Systems," Turbo Code Applications: A Journey from a Paper to Realization, Dec. 31, 2005, pp. 17-44.

Extended European Search Report dated Oct. 14, 2010.

F, Fekri, et al., "On Decoding of Low-Density Parity-Check Codes Over the Binary Erasure Channel," IEEE Transactions on Information Theory, vol. 50, No. 3, Mar. 2004, pp. 439-454.

Y. Han, et al., "LDPC Decoder Strategies for Achieving Low Error Floors," IEEE Information Theory and Applications Workshop, Jan. 2008, pp. 1-10.

T. Wadayama, "Average Stopping Set Weight Distribution of Redundant Random Matrix Ensembles," IEEE International Symposium on Information Theory, Jun. 2007, pp. 2931-2935.

M. Baldi, et al., "Variable Rate LDPC Codes for Wireless Applications," IEEE International Conference on Computer Networks, Sep. 2006, pp. 1-5.

International Search Report dated Nov. 11, 2008.

C. Di et al., "Finite-Length Analysis of Low-Density Parity-Check Codes on the Binary Erasure Channel," IEEE Transactions on Information Theory, vol. 48, No. 6, Jun. 2002, pp. 1570-1579.

\* cited by examiner

P11: | INFORMATION PACKET 1 | INFORMATION PACKET 2 | INFORMATION PACKET 3 |

FIG.9A

P12: | INFORMATION PACKET 1 | INFORMATION PACKET 2 | INFORMATION PACKET 3 | PADDING PACKET 1 | PADDING PACKET 2 |

FIG.9B

P13: | INFORMATION PACKET 1 | PADDING PACKET 2 | PADDING PACKET 1 | INFORMATION PACKET 3 | INFORMATION PACKET 2 |

FIG.9C

P14: | INFORMATION PACKET 1 | PADDING PACKET 2 | PADDING PACKET 1 | INFORMATION PACKET 3 | INFORMATION PACKET 2 | REDUNDANT PACKET 1 | REDUNDANT PACKET 2 | REDUNDANT PACKET 3 | REDUNDANT PACKET 4 | REDUNDANT PACKET 5 |

FIG.9D

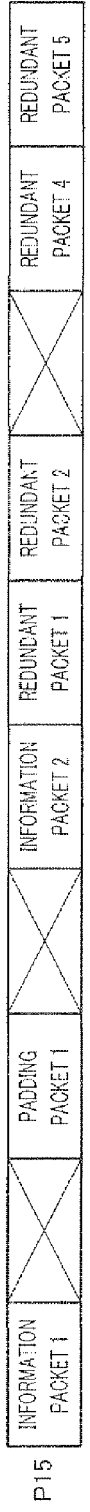
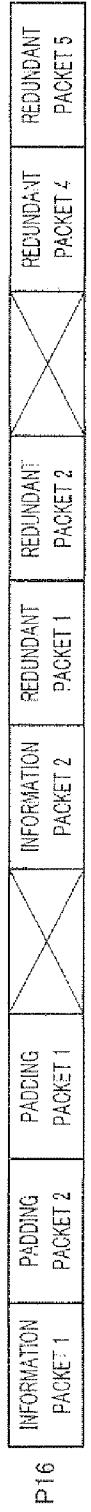
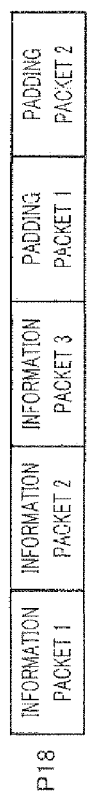
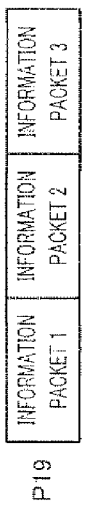
FIG.12A
FIG.12B
FIG.12C
FIG.12D
FIG.12E P21: | INFORMATION PACKET 1 | INFORMATION PACKET 2 | INFORMATION PACKET 3 | INFORMATION PACKET 4 | INFORMATION PACKET 5 |

FIG. 17A

P22: | INFORMATION PACKET 1 | INFORMATION PACKET 2 | INFORMATION PACKET 3 | INFORMATION PACKET 4 | INFORMATION PACKET 5 | REDUNDANT PACKET 1 | REDUNDANT PACKET 2 | REDUNDANT PACKET 3 | REDUNDANT PACKET 4 | REDUNDANT PACKET 5 |

FIG. 17B

P23: | INFORMATION PACKET 1 | INFORMATION PACKET 2 | INFORMATION PACKET 3 | INFORMATION PACKET 4 | INFORMATION PACKET 5 | REDUNDANT PACKET 3 | REDUNDANT PACKET 4 | REDUNDANT PACKET 5 | REDUNDANT PACKET 1 | REDUNDANT PACKET 2 |

FIG. 17C

P24: | INFORMATION PACKET 1 | INFORMATION PACKET 2 | INFORMATION PACKET 3 | INFORMATION PACKET 4 | REDUNDANT PACKET 3 | REDUNDANT PACKET 4 | REDUNDANT PACKET 2 |

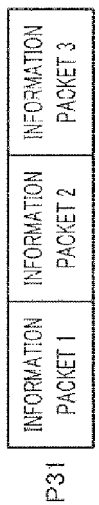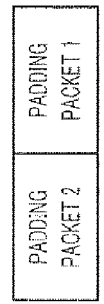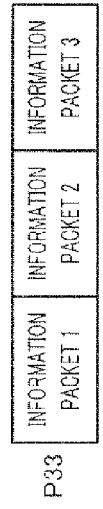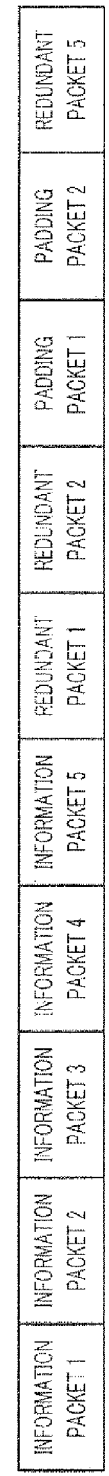
FIG.33A
FIG.33B
FIG.33C
FIG.33D

| | 1ST | 2ND | 3RD | 4TH | 5TH | 6TH | 7TH | 8TH | 9TH | 10TH |
|---|---|---|---|---|---|---|---|---|---|---|
| P35 | INFORMATION PACKET 1 | ✕ | INFORMATION PACKET 3 | ✕ | INFORMATION PACKET 5 | REDUNDANT PACKET 1 | REDUNDANT PACKET 2 | ✕ | PADDING PACKET 2 | REDUNDANT PACKET 5 |

FIG.34A

| | 1ST | 2ND | 3RD | 4TH | 5TH | 6TH | 7TH | 8TH | 9TH | 10TH |
|---|---|---|---|---|---|---|---|---|---|---|
| P36 | INFORMATION PACKET 1 | ✕ | INFORMATION PACKET 3 | ✕ | INFORMATION PACKET 5 | REDUNDANT PACKET 1 | REDUNDANT PACKET 2 | PADDING PACKET 1 | PADDING PACKET 2 | REDUNDANT PACKET 5 |

FIG.34B

| | 1ST | 2ND | 3RD | 4TH | 5TH | 6TH | 7TH | 8TH | 9TH | 10TH |
|---|---|---|---|---|---|---|---|---|---|---|
| P37 | INFORMATION PACKET 1 | INFORMATION PACKET 2 | INFORMATION PACKET 3 | INFORMATION PACKET 4 | INFORMATION PACKET 5 | REDUNDANT PACKET 1 | REDUNDANT PACKET 2 | PADDING PACKET 1 | PADDING PACKET 2 | REDUNDANT PACKET 5 |

FIG.34C

| | 1ST | 2ND | 3RD | 4TH | 5TH |
|---|---|---|---|---|---|
| P38 | INFORMATION PACKET 1 | INFORMATION PACKET 2 | INFORMATION PACKET 3 | PADDING PACKET 1 | PADDING PACKET 2 |

FIG.34D

| | 1ST | 2ND | 3RD |
|---|---|---|---|
| P39 | INFORMATION PACKET 1 | INFORMATION PACKET 2 | INFORMATION PACKET 3 |

FIG.34E

| INFORMATION PACKET 1 | INFORMATION PACKET 2 | INFORMATION PACKET 3 |
|---|---|---|

| INFORMATION PACKET 1 | INFORMATION PACKET 2 | INFORMATION PACKET 3 | PADDING PACKET 1 |
|---|---|---|---|

| INFORMATION PACKET 1 | INFORMATION PACKET 2 | PADDING PACKET 1 | INFORMATION PACKET 3 |
|---|---|---|---|

| INFORMATION PACKET 1 | PADDING PACKET 2 | PADDING PACKET 1 | INFORMATION PACKET 3 | REDUNDANT PACKET 1 | REDUNDANT PACKET 2 | REDUNDANT PACKET 3 | REDUNDANT PACKET 4 |
|---|---|---|---|---|---|---|---|

| P45 | INFORMATION PACKET 1 | INFORMATION PACKET 2 | ✗ | ✗ | REDUNDANT PACKET 1 | REDUNDANT PACKET 2 | REDUNDANT PACKET 3 | REDUNDANT PACKET 4 |

FIG.38A

| P46 | INFORMATION PACKET 1 | INFORMATION PACKET 2 | PADDING PACKET 1 | ✗ | REDUNDANT PACKET 1 | REDUNDANT PACKET 2 | REDUNDANT PACKET 3 | REDUNDANT PACKET 4 |

FIG.38B

| P47 | INFORMATION PACKET 1 | INFORMATION PACKET 2 | PADDING PACKET 1 | INFORMATION PACKET 3 |

FIG.38C

| P48 | INFORMATION PACKET 1 | INFORMATION PACKET 2 | INFORMATION PACKET 3 | PADDING PACKET 1 |

FIG.38D

| P49 | INFORMATION PACKET 1 | INFORMATION PACKET 2 | INFORMATION PACKET 3 |

FIG.38E

ENCODING DEVICE AND DECODING DEVICE

TECHNICAL FIELD

The present invention relates to an encoding apparatus and decoding apparatus that perform erasure correction of information data by adding redundancy to information data using, for example, low-density parity-check ("LDPC") codes.

BACKGROUND ART

A system that performs communication based on packets using IP (Internet Protocol) generally uses a communication scheme for performing end-to-end retransmission control using TCP (Transport Control Protocol) in an upper protocol and a communication scheme for not performing retransmission control such as UDP (User Datagram Protocol), TCP is mainly employed when it is necessary to secure reliability in packet communication, for example, when text data such as a web page is transmitted and received or when a file is downloaded from a server. By contrast with this, UDP is employed when packet erasure is acceptable to some degree at the level of an application, for example, when streaming transmission of moving images is performed or speech transmission is performed using VoIP (Voice over IP). Further, if end-to-end retransmission control is employed to perform multicast communication, the number of ACK (Acknowledgement)/NACK (Negative Acknowledgement) signals increase in proportion to the number of receiving terminals and then the network load and the amount of processing in a transmitting-receiving terminal increase, and therefore UDP is employed in this case.

To secure quality in case where a great amount of packet erasure, which is not acceptable at the level of an application, occurs even in moving image streaming or VoIP or to secure reliability in multicast communication, error correction codes are used on an end-to-end basis. For example, Patent Document 1 discloses a communication method for adding redundant packets created using Reed-Solomon codes, to some information packets and transmitting the packets. In this case, even if packet erasure occurs in received packets, a communication apparatus that has received these packets can restore the lost packet within the range of error correction performance of Reed-Solomon codes.

However, error correction is not effective in case where the amount of erasure is beyond correction performance of Reed-Solomon codes or in case where burst erasure occurs in which packets are lost continuously for a comparatively long period due to physical phenomena such as shadowing and fading that occur when a wireless communication channel is used as the medium for performing packet communication. In this case, although it is possible to improve correction performance by increasing a block length of Reed-Solomon code, there is a problem that the amount of operations in encoding/decoding processing and the circuit scale for these operations increase.

In response to this problem, low density parity check ("LDPC") codes are gaining attention as error correction codes for packet erasure. An LDPC code is a block code that is defined by a very sparse parity check matrix, and allows encoding/decoding processing within a practical period and at a practical operation cost even if the code length is in the order of several thousands to several ten thousands.

FIG. 1 is a conceptual diagram of a communication system utilizing erasure correction coding using an LDPC code. In FIG. 1, a communication apparatus on an encoding side performs LDPC coding of information packets 1 to 4 to be transmitted, to generate redundant packets a and b. An upper layer processing section outputs encoded packets adding redundant packets to information packets, to a lower layer (i.e. the physical layer with the example of FIG. 1), and the physical layer processing section of the lower layer converts the encoded packets in a format that can be transmitted on a communication channel and outputs the encoded packets to the communication channel. FIG. 1 shows an example in case where a communication channel is a wireless communication channel.

The communication apparatus on the decoding side performs receiving processing in the physical layer processing section of the lower layer. At this time, assume that bit error has occurred. Due to this bit error, the packet including that bit that caused error is not reproduced in the upper layer, thereby causing packet erasure. FIG. 1 shows an example of a case where the information packet 3 is lost. The upper layer processing section restores the lost information packet 3 by performing LDPC decoding processing of the received packet sequence.

Generally, the decoding side decodes an LDPC code using an iterative decoding algorithm. An example of an iterative decoding algorithm for an LDPC code for packet erasure correction will be explained using FIG. 2 and FIG. 3. Further, a case will be explained below as an example where a parity check matrix H of an LDPC code is a matrix represented by equation 1.

[1]

$$H = \begin{pmatrix} 1 & 1 & 0 & 1 & 1 & 1 & 1 & 0 & 0 & 0 \\ 1 & 1 & 0 & 0 & 1 & 0 & 0 & 1 & 1 & 1 \\ 1 & 0 & 1 & 0 & 1 & 0 & 1 & 0 & 1 & 1 \\ 0 & 1 & 1 & 1 & 0 & 1 & 0 & 1 & 1 & 0 \\ 0 & 0 & 1 & 1 & 0 & 1 & 1 & 1 & 0 & 1 \end{pmatrix} \quad \text{(Equation 1)}$$

FIG. 2 shows the parity check matrix H of equation 1 using a Tanner graph. In this figure, variable nodes represent the relationship in the column direction of the parity check matrix H, and the check nodes represent the relationship in the row direction of the parity check matrix H. Further, in case where the elements in the parity check matrix H are one, a variable node is connected to a check node by a line (i.e. edge). Further, each variable node corresponds to an encoded packet.

FIG. 3 is a flowchart of an iterative decoding algorithm for LDPC decoding. The iterative decoding algorithm will be explained below according to the flowchart. In this figure, ST indicates each step in the flowchart.

In ST11, a received codeword including erasure is inputted to an applicable variable node. In ST12, a check node that is connected with a variable node at which the amount of erasure is one is extracted In case where a check node at which the amount of erasure is one is extracted (ST13: YES), the values of variable nodes that have been correctly received (that are not lost) are subjected to an XOR (exclusive OR) operation in the extracted check node at which the amount of erasure is one. Then, the XOR operation results acquired in ST15 and ST14 are inputted to the variable node that is lost, and the step returns to ST12.

By contrast with this, in case where a check node at which the amount of erasure is one (ST13: NO) is not extracted, whether or not there is erasure in all check nodes is checked, and, if there is not erasure, the decoding algorithm is finished assuming that erasure correction was successful (ST16: YES)

or, if there is erasure, the decoding algorithm is finished assuming that erasure correction failed (ST16: NO).

An LDPC code is configured much more flexibly than other codes such as Reed-Solomon codes, and can support various code lengths and coding rates by using different parity check matrices. However, in a system that supports a plurality of code lengths and coding rates, the encoding side and decoding side need to hold a plurality of parity check matrices. In response to this problem, Patent Document 2 discloses an encoding/decoding apparatus that can support a plurality of code lengths using one parity check matrix by adding padding bits to information bit sequences.

Further, to adjust a coding rate, a puncturing method for increasing the coding rate by not transmitting part of redundant packets encoded at a certain coding rate, is generally employed. Puncturing reduces the number of redundant packets and the rate of redundant packets included in an encoded packet sequence, so that it is possible to increase the coding rate. In this case, both the encoding side and decoding side know in advance the positions of redundant packets to puncture, and the decoding side performs decoding processing assuming that punctured packets are lost, so that it is possible to decode codes of various coding rates using a decoding apparatus that supports a certain coding rate. Further, puncturing is employed to adjust coding rates not only in case where error correction coding is performed in packet units but also in case where error correction coding is performed in the physical layer in bit units.

Patent Document 1 Japanese Patent Application Laid-Open No. HE18-186570

Patent Document 2: Japanese Patent Application Laid-Open No. 2006-94012

Non-Patent Document 1: "Finite-Length Analysis of Low-Density Parity-Check Codes on the Binary Erasure Channel," Changyan Di, David Proietti, I. Emme Telatar, Thomas J. Richardson, and Rudiger L. Urbanke, IEEE Transaction on Information Theory, vol. 48, No. 6, June 2002.

DISCLOSURE OF INVENTION

Problems to be Solved by the Invention

However, performance of erasure correction using an LDPC code is limited by a combination of variable nodes which is referred to as a "minimum stopping set," determined by the parity check matrix used in encoding/decoding. This will be explained.

A "stopping set" refers to a set (i1, i2, . . . , is) of variable nodes in case where a matrix $H'=(c_{i1}, c_{i2}, \ldots, c_{is})$, which is formed with subsets of the parity check matrix $H=(c_1, c_2, \ldots, c_n)$, does not include column vectors having a degree of 1 when n column vectors ci(i=1, 2, . . . , n) are represented as $H=(c_1, c_2, \ldots, c_n)$ (see Non-Patent Document 1), and the "minimum stopping set" refers to a stopping set in case where the number of variable nodes forming the stopping set is minimum.

Erasure correction using LDPC codes makes correct erasure correction decoding difficult in case where there is erasure in all packets corresponding to variable nodes forming stopping sets in the parity check matrix H. This will be explained additionally using a specific example.

FIG. 4 is a graph showing erasure correction decoding performance in case where erasure correction coding is performed using an array LDPC code of a code length N=529 and coding rate R=0.913. The horizontal axis in the graph represents the probability of packet erasure on a communication channel, and the vertical axis represents the rate of packet erasure subjected to decoding. In this case, cases occur where, even if 46 redundant packets are added upon encoding, correction is difficult on a communication channel having the low rate of packet erasure of 0.01 (that is, about five packets are lost in 529 packets). This is because, even if the minimum stopping set size (i.e. the minimum value of the number of variable nodes forming a stopping set) of an array LDPC code of the code length N=529 and coding rate R=0.913 is four and the number of packets lost is four, decoding fails if the four lost packets match the packets in the positions in minimum stopping sets.

In this way, performance of erasure correction using LDPC codes that employ iterative decoding depends on the combination of variable nodes in minimum stopping sets. That is, in case where packets corresponding to the positions of all variable nodes forming a certain minimum stopping set are lost, it is difficult to correct this amount of erasure by iterative decoding.

Therefore, in order to improve performance of erasure correction code using LDPC codes, it is necessary to (1) increase the minimum stopping set size or (2) reduce the number of minimum stopping sets included in the parity check matrix.

Further, in case where the coding rate of an LDPC code is adjusted by performing puncturing as described above, the decoding side assumes that punctured packets (or bits) are lost. Therefore, in case where positions punctured on the encoding side are included in one minimum stopping set, there is a possibility that decoding performance deteriorates significantly.

It is therefore an object of the present invention to provide an encoding apparatus and decoding apparatus that can effectively reduce the frequency of decoding failure in LDPC encoding/decoding.

Means for Solving the Problem

One aspect of the encoding apparatus according to the present invention employs a configuration which includes: a padding section that adds a packet sequence that is known between an encoding side and a decoding side, to an information packet sequence; an interleaving section that reorders the packet sequence to which the known packet sequence is added; and a erasure correction coding section that performs packet erasure correction coding of the reordered packet sequence.

According to this configuration, the coding rate can be adjusted by adding a known packet sequence, and, by assigning known packets to positions which significantly influence the characteristics of erasure correction performance, erasure correction decoding can be performed after performing re-padding using known packets on the decoding side even in case where these known packets are lost on the communication channel, so that it is possible to suppress deterioration in error correction decoding performance in case where packets other than these known packets are lost.

Advantageous Effects of Invention

According to the present invention, it is possible to effectively reduce the frequency of decoding failure in LDPC encoding/decoding.

BRIEF DESCRIPTION OF DRAWINGS

FIG. 9 illustrates the operation of the erasure correction coding apparatus according to Embodiment 1;

FIG. 12 illustrates the operation of the erasure correction decoding apparatus according to Embodiment 1;

FIG. 17 illustrates the operation of the erasure correction coding apparatus according to Embodiment 2;

FIG. 21 illustrates the operation of the erasure correction decoding apparatus according to Embodiment 2;

FIG. 33 illustrates the operation of the erasure correction coding apparatus according to Embodiment 4;

FIG. 34 illustrates the operation of the erasure correction decoding apparatus according to Embodiment 4;

FIG. 37 illustrates the operation of the erasure correction coding apparatus according to Embodiment 5; and FIG. 38 illustrates the operation of the erasure correction decoding apparatus according to Embodiment 5.

BEST MODE FOR CARRYING OUT THE INVENTION

Hereinafter, embodiments of the present invention will be explained in details below with reference to the accompanying drawings.

Embodiment 1

Figure 5:
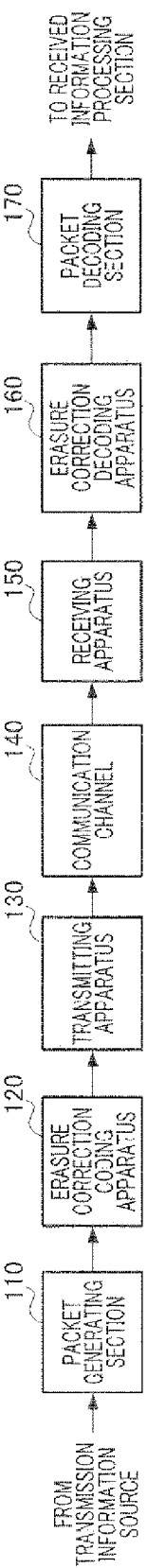
FIG. 5 shows an overall configuration of the communication system according to Embodiment 1 of the present invention.

FIG. 5 shows an overall configuration of a communication system according to Embodiment 1 of the present embodiment. In FIG. 5, the communication system is formed with packet generating section 110, erasure correction coding apparatus 120, transmitting apparatus 130, communication channel 140, receiving apparatus 150, erasure correction decoding apparatus 160 and packet decoding section 170. In the same figure, packet generating section 110, erasure correction coding apparatus 120 and transmitting apparatus 130 are on the encoding side, and receiving apparatus 150, erasure correction decoding apparatus 160 and packet decoding section 170 are on the decoding side.

Figure 6:
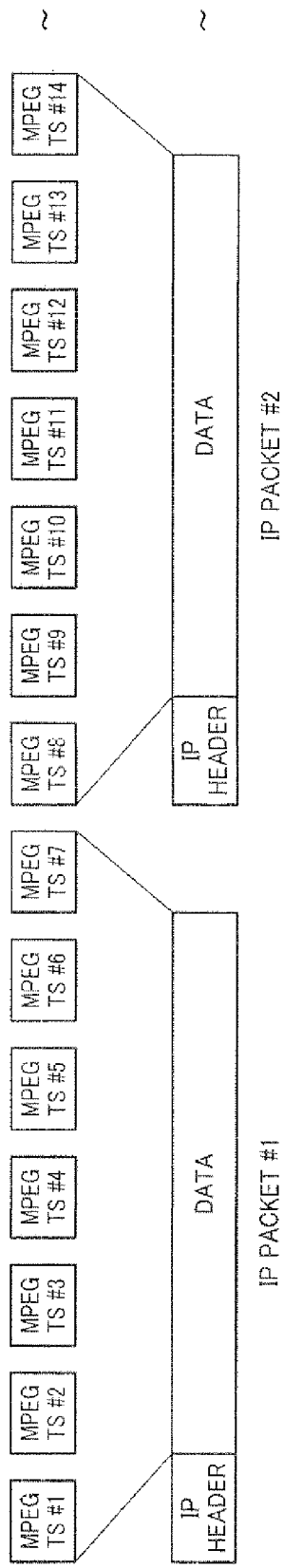
FIG. 6 shows packet sequences generated by a packet generating section according to Embodiment 1.

Packet generating section 110 adds a header to transmission information outputted from the transmission information source, and converts this information into information packets. For example, as shown in FIG. 6, to convert TSs (Transport Streams) of MPEG (Moving Picture Expert Group) given as transmission information, into an IP packet, packet generating section 110 binds seven MPEG-TSs and adds an IP header to the head of the seven MPEG-TSs, to generate an IP packet. Packet generating section 110 outputs the generated information packets to erasure correction coding apparatus 120.

Erasure correction coding apparatus 120 performs erasure correction coding processing of the information packets outputted from packet generating section 110. To be more specific, as erasure correction coding processing, erasure correction coding apparatus 120 adds a redundant packet every other information packets the number of which is determined upon encoding. Erasure correction coding apparatus 120 outputs the information packets and redundant packets to transmitting apparatus 130. Hereinafter, an information packet and redundant packet will be referred to as a "transmission packet."

Depending on the medium that is used as the communication channel, transmitting apparatus 130 converts the transmission packets outputted from erasure correction coding apparatus 120, into a format that can be transmitted on the communication channel, and transmits the transmission packets to communication channel 140.

Communication channel 140 refers to the route through which a signal transmitted from transmitting apparatus 130 travels until it is received by receiving apparatus 150. As communication channels, Ethernet (registered trademark), electric wires, metal cables, optical fibers, radio, light (e.g., visible light or infrared light) and combinations of these may be used.

Receiving apparatus 150 receives a signal that arrives from transmitting apparatus 130 through communication channel 140, and converts the signal into the format of transmission packets again. Hereinafter, these transmission packets will be referred to as "received packets." Receiving apparatus 150 outputs the received packets to erasure correction decoding apparatus 160.

When packets are lost among the received packets, erasure correction decoding apparatus 160 performs restoring processing of lost packets utilizing redundant packets added in erasure correction coding apparatus 120 on the encoding side. Erasure correction decoding apparatus 160 outputs only the packets corresponding to information packets of received packets subjected to restoring processing, to packet decoding section 170. By contrast with this, when packets are not lost among received packets, erasure correction decoding apparatus 160 outputs to packet decoding section 170 only the packets corresponding to information packets of the received packets without performing decoding processing.

Packet decoding section 170 converts packetized transmission information into a format that can be decrypted in the received information processing section (not shown), and transmits the packetized transmission information to the received information processing section. With the example of FIG. 6, the seven MPEG-TSs are extracted from data of an IP packet and are outputted to the received information processing section.

Figure 7:
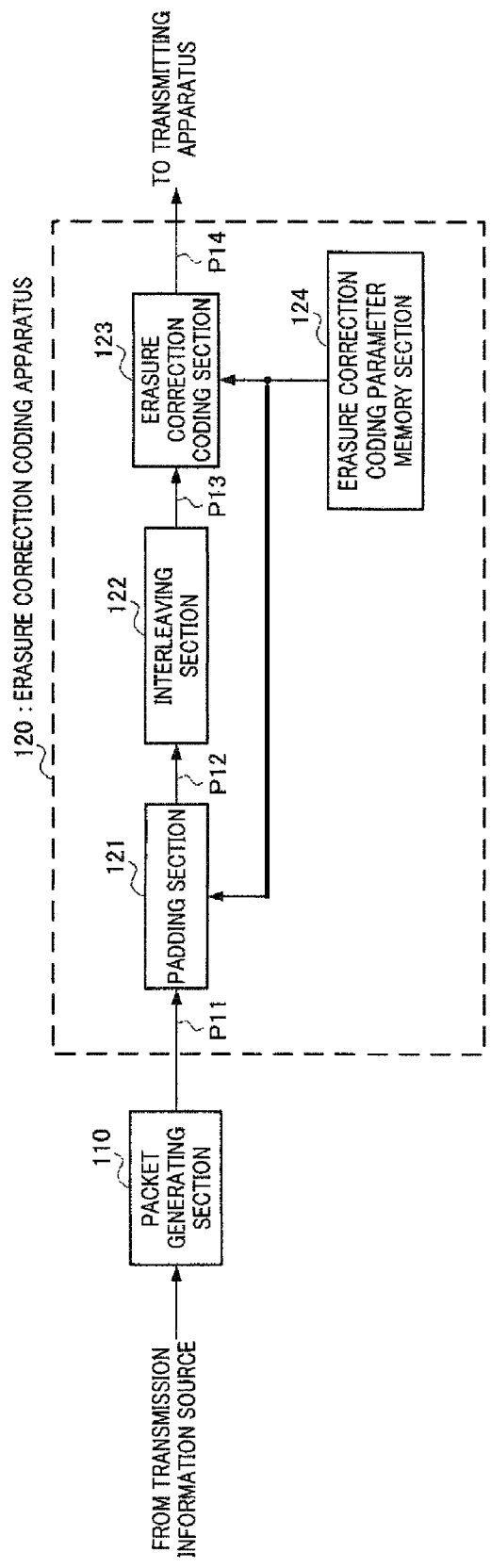
FIG. 7 is a block diagram showing the configuration of main parts of the erasure correction coding apparatus according to Embodiment 1.

FIG. 7 shows the configuration of main parts of erasure correction coding apparatus 120 according to Embodiment 1 of the present invention. Erasure correction coding apparatus 120 uses a low density parity check ("LDPC") code as a erasure correction code. A case will be explained below as an example where erasure correction coding apparatus 120 performs erasure correction coding in units of J information packets. Packet generating section 110 outputs generated information packets to erasure correction coding apparatus 120 in units of J information packets. Further, the number of information packets J is determined based on the total amount of information to transmit and the number of packets to transmit per time.

Erasure correction coding apparatus 120 is formed with padding section 121, interleaving section 122, erasure correction coding section 123 and erasure correction coding parameter memory section 124.

Erasure correction coding parameter memory section 124 stores LDPC code parameters used in erasure correction coding. To be more specific, the parity check matrix H, encoded packet length N, organizing packet length K, redundant packet length M and padding packet length P are stored as LDPC code parameters.

Padding section 121 adds padding packets that are known between the encoding side and decoding side, to the rear portion of the J information packets outputted from packet generating section 110, and generates an organizing packet sequence formed with K packets. Padding section 121 adds padding packets based on the padding packet length P, and outputs the organizing packet sequence to interleaving section 122.

Interleaving section 122 performs interleaving processing of reordering packets of the organizing packet sequence. Interleaving section 122 outputs the interleaved organizing packet sequence (hereinafter, "interleaved packet sequence"), to erasure correction coding section 123. Further, interleaving processing will be described later.

Erasure correction coding section 123 performs LDPC coding processing of the interleaved packet sequence based on the parity check matrix H held in erasure correction coding parameter memory section 124, and generates a redundant packet sequence. Further, erasure correction coding section 123 adds the generated redundant packet sequence to the rear portion of the interleaved packet sequence, and outputs the encoded packet sequence to which the redundant packet sequence is added, to transmitting apparatus 130.

Figure 8:
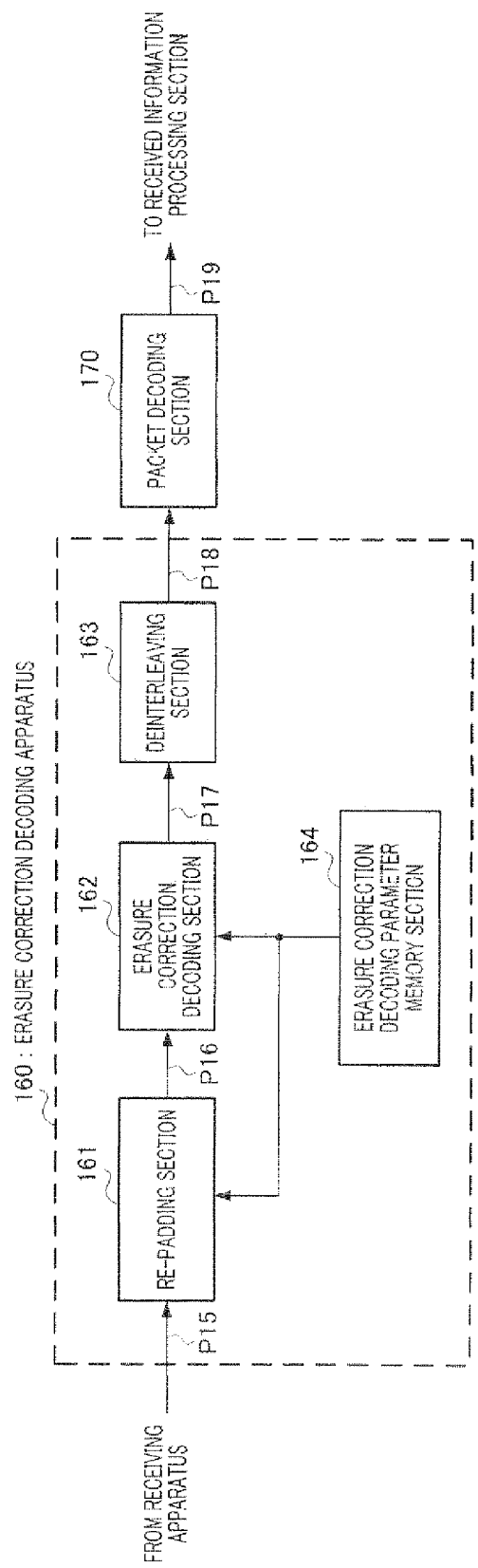
FIG. 8 is a block diagram showing the configuration of main parts of the erasure correction decoding apparatus according to Embodiment 1.

FIG. 8 shows the configuration of main parts of erasure correction decoding apparatus 160 according to Embodiment 1 of the present invention. Erasure correction decoding apparatus 160 is formed with re-padding section 161, erasure correction decoding section 162, deinterleaving section 163 and erasure correction decoding parameter memory section 164.

Erasure correction decoding parameter memory section 164 stores LDPC code parameters used in erasure correction coding/decoding.

When there is erasure in the received packet sequence and when a padding packet is lost, re-padding section 161 inserts a padding packet again in a position in which the packet erasure has occurred. Re-padding section 161 outputs the re-padded packet sequence to erasure correction decoding section 162.

Erasure correction decoding section 162 performs erasure correction decoding processing of the re-padded packet sequence based on the parity check matrix H, extracts only packets corresponding to the organizing packet sequence from the decoding result and outputs the extracted organizing packet sequence subjected to erasure correction decoding, to deinterleaving section 163.

Deinterleaving section 163 performs reverse reordering processing (i.e. deinterleaving processing) of the interleaving processing performed on the encoding side, with respect to the organizing packet sequence subjected to erasure correction decoding. Deinterleaving section 163 outputs only the packets corresponding to the information packet sequence of the organizing packet sequence subjected to deinterleaving processing, to packet decoding section 170.

The operations of erasure correction coding apparatus 120 and erasure correction decoding apparatus 160 in the communication system formed as described above, will be mainly explained below. Further, a case will be explained below as an example where three information packets (J=3) are outputted from packet generating section 110. Furthermore, a case will be explained as an example where erasure correction coding/decoding is performed using the above-described matrix represented by equation 1 as the parity check matrix H that defines an LDPC code used as a erasure correction code. The parity check matrix H of equation 1 is an example of a case where the encoded packet length is N=10, the organizing packet length is K=5 and the redundant packet length is M=5.

(Operation of the Erasure Correction Coding Apparatus)

FIG. 9 shows packet sequences inputted in and outputted from each section of erasure correction coding apparatus 120.

Further, the same reference numerals as the corresponding packet sequences of FIG. 7 will be assigned in FIG. 9.

FIG. 9A shows the information packet sequence P11 outputted from packet generating section 110. The information packet sequence P11 is formed with three information packets.

Padding section 121 adds a padding packet sequence formed with two (=P=K−J) padding packets, to the rear portion of the information packet sequence P11 outputted from packet generating section 110, and generates the organizing packet sequence P12 formed with five packets (see FIG. 9B).

Interleaving section 122 performs interleaving processing of the organizing packet sequence P12. Practically, interleaving section 122 performs interleaving by means of the following processings.

(Interleaving Processing)

(1) All minimum stopping sets included in the parity check matrix H are extracted.

(2) How many minimum stopping sets in all combinations of minimum stopping sets include each variable node corresponding to the organizing packet sequence, is checked.

(3) Each variable node corresponding to the organizing packet sequence is reordered in order from a variable node included in a greater number of minimum stopping sets. Hereinafter, the reordering result will be referred to as the "variable node list."

(4) The packet of the variable node corresponding to the first place in the variable node list is replaced with the packet at the tail of the organizing packet sequence P12, that is, a padding packet.

(5) Next, the packet of the variable node corresponding to the second place in the variable node list is replaced with the second packet from the tail of the organizing packet sequence, that is, a redundant packet.

(6) Therefore, a packet corresponding to a variable node in a higher place in the variable node list is sequentially replaced with a padding packet to perform interleaving processing.

Note that processings (1) to (3) of the above interleaving processing needs not to be performed every interleaving processing and every coding processing, and, for example, interleaving section 122 may perform only processings (4) to (6) by performing processings (1) to (3) in advance and storing the result in erasure correction coding parameter memory section 124.

In this way, to perform interleaving processing, interleaving section 122 performs processing of replacing a padding packet positioned in the rear portion of the organizing packet sequence P12, with a packet in a position corresponding to one of variable nodes which correspond to organizing packet sequences and which form a minimum stopping set in the parity check matrix H that is used in LDPC coding. By replacing the padding packet positioned in the rear portion of the organizing packet sequence P12, with the packet in a position corresponding to one of variable nodes forming a minimum stopping set in the parity check matrix H that is used in LDPC coding, interleaving section 122 assigns padding packets to the positions corresponding to variable nodes forming a minimum stopping set.

When above steps (1) to (6) are performed, a padding packet is preferentially assigned to the position corresponding to a variable node, in order from a variable node included in a greater number of minimum stopping sets. Interleaving processing will be explained additionally further using FIG. 10.

Figure 10:
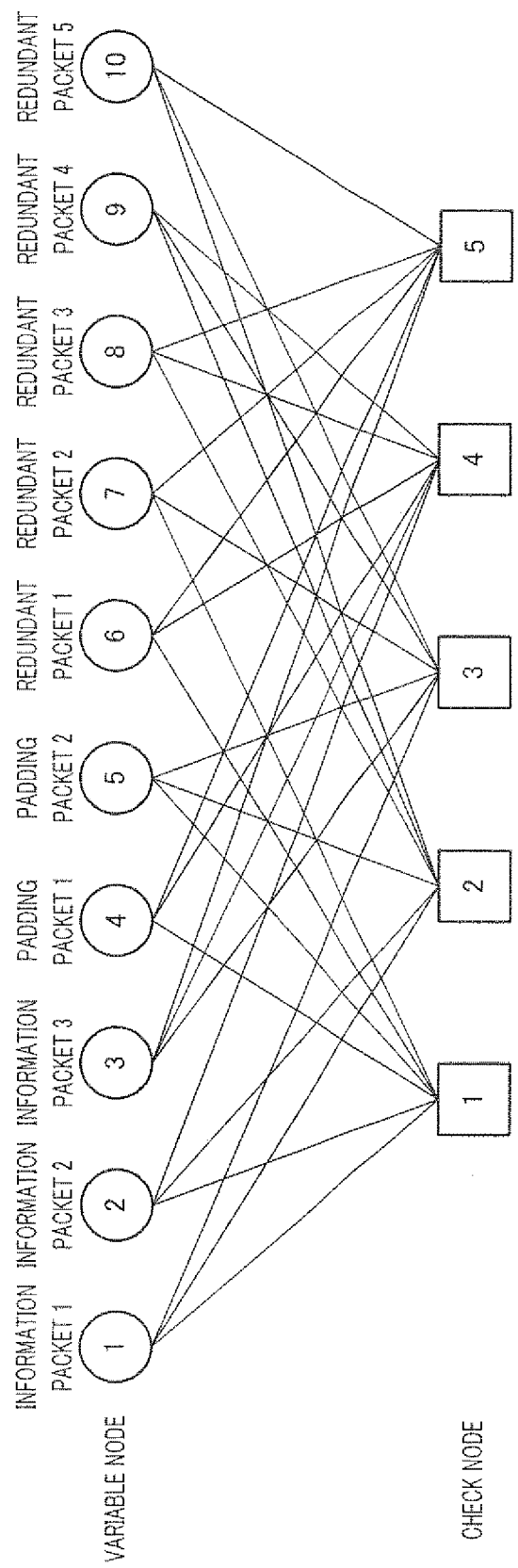
FIG. 10 is a Tanner graph used in the erasure correction coding apparatus according to Embodiment 1.

FIG. 10 shows a Tanner graph matching the parity check matrix H of equation 1. In FIG. 10, variable nodes in the upper part correspond to each column of the parity check matrix H of equation 1, and check nodes in the lower part correspond to each row of the parity check matrix H. When the element is 1 in the i-th row and the j-th column in the parity check matrix H, the j-th variable node and i-th check node is connected with a line.

Further, packets assigned to variable nodes when interleaving processing is not performed prior to erasure correction coding processing, are also shown above the variable nodes in FIG. 10. With the example of FIG. 10, the variable nodes 1 to 5 correspond to the organizing packet sequence, and the variable nodes 6 to 10 correspond to the redundant packet sequence. To be more specific, the information packets 1 to 3 correspond to the variable nodes 1 to 3, the padding packets 1 and 2 correspond to the variable nodes 4 and 5 and the redundant packets 1 to 5 resulting from erasure correction coding processing correspond to the variable nodes 6 to 10.

The minimum stopping set size of the parity check matrix H obtained by equation 1 is three, and there are seven combinations of variable nodes, as presented in equation 2-1 to equation 2-7 (where the numbers in [ ] represent the indices of variable nodes).

[2]

$$SS1=[1,2,9] \quad \text{(Equation 2-1)}$$

$$SS2=[2,4,8] \quad \text{(Equation 2-2)}$$

$$SS3=[2,5,9] \quad \text{(Equation 2-3)}$$

$$SS4=[2,6,8] \quad \text{(Equation 2-4)}$$

$$SS5=[3,4,7] \quad \text{(Equation 2-5)}$$

$$SS6=[3,6,7] \quad \text{(Equation 2-6)}$$

$$SS7=[3,8,9] \quad \text{(Equation 2-7)}$$

The variable node 2 is one of the variable nodes 1 to 5 corresponding to the organizing packet sequence, and is included in the greatest number of minimum stopping sets out of the above seven minimum stopping sets (that is, the variable node 2 is included in four patterns out of the seven patterns). Further, the variable node 3 is included in the second greatest number of minimum stopping sets (that is, the variable node 3 is included in three patterns out of the seven patterns).

Figures 11A, 11B:
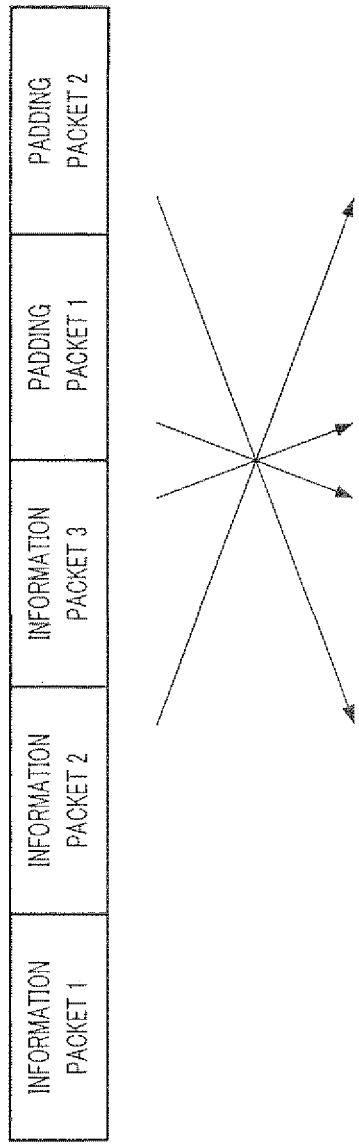
FIG. 11 shows an example of an interleaving pattern according to Embodiment 1.

Interleaving section 122 replaces (i.e. interleaves) the packet (i.e. padding packet 2) at the tail of the organizing packet sequence P12, with the information packet 2 in a position corresponding to the variable node 2. Further, interleaving section 122 replaces the information packet 3 in a position corresponding to the variable node 3, with the second packet (i.e. padding packet 1) from the tail of the organizing packet sequence P12. FIG. 11 shows the interleaving processing pattern in this case. FIG. 11A shows the order of packets before they are interleaved, and FIG. 11B shows the order of interleaved packets.

In this way, interleaving section 122 performs processing of replacing padding packets in the rear portion of the organizing packet sequence P12, with the packets that are assigned to part of variable nodes in a stopping set. That is, interleaving section 122 replaces information packets in positions corresponding to variable nodes forming a minimum stopping set in the parity check matrix H, with padding packets which are known packets. As a result, the interleaved packet sequence P13 shown in FIG. 9C is acquired.

By so doing, the padding packets 2 and 1 are arranged in the position of the variable node 2 which is one of the variable nodes 1 to 5 corresponding to the organizing packet sequence and which is included in the greatest number of minimum stopping sets, and in the position of the variable node 3 which is one of the variable nodes 1 to 5 and which is included in the second greatest number of minimum stopping sets. The padding packets 2 and 1 are known packets, so that, even when the padding packets 2 and 1 in positions corresponding to the variable nodes 2 and 3 are lost on communication channel 140, re-padding section 161 of erasure correction decoding apparatus 160 on the decoding side can re-pad the padding packets 2 and 1 that are lost. Consequently, even when packets in positions corresponding to other variable nodes in minimum stopping sets including the variable nodes 2 and 3 are lost, there is a possibility that erasure correction decoding section 162 can perform erasure correction decoding.

By contrast with this, when the information packets 2 and 3 in positions corresponding to the variable nodes 2 and 3 are lost because interleaving processing is not performed, the information packets 2 and 3 are not known and, therefore, it is difficult for re-padding section 161 to perform re-padding. Further, when packets in positions corresponding to other variable nodes in the minimum stopping sets including the variable nodes 2 and 3 are lost, there is a higher possibility that erasure correction decoding section 162 fails to perform erasure correction decoding processing.

Erasure correction coding section 123 generates the redundant packets 1 to 5 based on the parity check matrix H held in erasure correction coding parameter memory section 124 and adds the redundant packets 1 to 5 to the interleaved packet sequence P13 to generate the encoded packet sequence P14 formed with the N packets shown in FIG. 9D.

In this way, interleaving section 122 assigns a padding packet preferentially to a position corresponding to the variable node which is one of variable nodes corresponding to the organizing packet sequence and which is included in the greatest number of minimum stopping sets in the parity check matrix H. By so doing, even when a packet in a position corresponding to a variable node that influences erasure correction the most significantly is lost, re-padding section 161 of erasure correction decoding apparatus 160 on the decoding side can perform re-padding, so that it is possible to increase the possibility of erasure correction decoding.

(Operation of the Erasure Correction Decoding Apparatus)

Next, the operation of erasure correction decoding apparatus 160 will be explained. FIG. 12 shows packet sequences inputted in and outputted from each section of erasure correction decoding apparatus 160. Further, the same reference numerals as the corresponding packet sequences in FIG. 8 will be assigned in FIG. 12.

FIG. 12A shows the received packet sequence P15 outputted from receiving apparatus 150. In FIG. 12A, three packets to which "x" symbols are assigned represent packets that are lost on communication channel 140. FIG. 12A shows an example of a case where the second, fourth and eighth packets are lost. Variable nodes corresponding to three lost packets are the variable nodes 2, 4 and 8, and the combination of these variable nodes [2, 4, and 8] matches the minimum stopping set SS2 shown in equation 2-2. Further, one of the lost packets (i.e. the second packet) is the padding packet 2 that is padded on the encoding side.

Re-padding section 161 determines the position to which a padding packet is inserted on the encoding side, based on the number of padding packets P (=2) held in erasure correction decoding parameter memory section 164 and a pattern of deinterleaving performed in deinterleaving section 163. Further, re-padding section 161 decides whether or not padding packets are included in the lost packets and, when padding packets are included in the lost packets, re-padding section 161 inserts padding packets again to the positions of the lost packets. Here, the packet in the second position from the head of the packet sequence is the padding packet 2 and, consequently, re-padding section 161 inserts the padding packet 2 to the second packet position. As a result, the packet sequence P16 shown in FIG. 12B is acquired. Further, when padding packets are not included in the lost packets, re-padding section 161 outputs the received packet sequence P15 to erasure correction decoding section 162 as the packet sequence P16 without performing re-padding.

When there is erasure in the organizing packet sequence in the packet sequence P16, erasure correction decoding section 162 performs erasure correction decoding processing based on the parity check matrix H held in erasure correction decoding parameter memory section 164. The above-described iterative decoding algorithm may be used for erasure correction decoding processing. After decoding processing is finished, erasure correction decoding section 162 outputs only the organizing packet sequence P17 to deinterleaving section 163 as shown in FIG. 12C.

By contrast with this, when there is not erasure in the packet sequence P16 or when there is erasure only in a redundant packet sequence, erasure correction decoding section 162 outputs only the organizing packet sequence P17 to deinterleaving section 163 without performing erasure correction decoding processing.

Deinterleaving section 163 performs reverse processing of the interleaving processing performed in interleaving section 122 on the encoding side, with respect to the organizing packet sequence P17, and reorders packets. Referring to the above-described example of FIG. 9, deinterleaving section 163 replaces the padding packet 2 with the information packet 2 and replaces the padding packet 1 with the information packet 3. FIG. 12D shows the deinterleaved organizing packet sequence P18. The order of packets in the organizing packet sequence P18 in FIG. 12D matches the order of packets in the organizing packet sequence P12 before interleaving on the encoding side (see FIG. 9B).

Deinterleaving section 163 outputs the information packet sequence P19 formed only with information packets of the deinterleaved organizing packet sequence P18 shown in FIG. 12E, to packet decoding section 170.

As described above, interleaving section 122 on the encoding side assigns padding packets to positions corresponding to variable nodes which are ones of variable nodes corresponding to the organizing packet sequence and which form a minimum stopping set. With the example of FIG. 9, interleaving section 122 assigns a padding packet to the variable node 2. Consequently, even when packets (the second, fourth and eight packets) corresponding to variable nodes in the minimum stopping set SS2 are lost on communication channel 140, the second packet can be restored by means of re-padding, so that packet decoding section 170 makes it possible to avoid failure of erasure correction due to SS2. Further, with the example of FIG. 10, it is also possible to avoid failure of erasure correction due to other stopping sets (SS1, SS3 and SS4) than SS2 including the variable node 2 by assigning a known padding packet to the variable node 2.

In this way, interleaving section 122 on the encoding side replaces the padding packet positioned in the rear portion of the organizing packet sequence P12, with the packet in a position corresponding to one of variable nodes which correspond to the organizing packet sequence and which form a minimum stopping set in the parity check matrix H that is used in LDPC coding, and, consequently, even when there is erasure in positions in a minimum stopping set on communication channel 140, re-padding section 161 can perform re-padding, so that it is possible to avoid failure of erasure correction due to the minimum stopping set.

As described above, according to the present embodiment, erasure correction coding apparatus 120 has: padding section 121 that adds padding packets to an information packet sequence; interleaving section 122 that reorders the packet sequence to which the padding packets are added; and erasure coding section 123 that performs erasure correction coding of the interleaved packet sequence, and interleaving section 122 replaces padding packets with information packets based on variable nodes forming a minimum stopping set in the parity check matrix that defines the low density parity check code. Further, erasure correction decoding apparatus 160 has: re-padding section 161 that performs re-padding of the received packet sequence; erasure correction decoding section 162 that performs erasure correction decoding of the re-padded packet sequence; and deinterleaving section 163 that reorders the packet sequence subjected to erasure correction decoding. Consequently, it is possible to reduce the probability of failure of erasure correction due to the minimum stopping set by changing the pattern of reordering the organizing packet sequence, to such a reordering pattern to avoid failure of erasure correction due to the minimum stopping set, based on variable nodes forming the minimum stopping set that relates to limitation of the characteristics of correction performance of the LDPC parity check matrix.

In this way, by using the present invention, it is possible to provide an advantage of reducing the probability of failure of correction due to the minimum stopping set, which is the foremost factor that deteriorates the correction performance of a erasure correction code, by utilizing adequate interleaving/deinterleaving processing and padding packets that are conventionally inserted to adjust the number of packets involved in erasure correction coding/decoding. That is, it is possible to reduce the probability that packets lost on a communication channel match minimum stopping sets included in the parity check matrix and, consequently, improve erasure correction performance.

In case where interleaving section 122 performs interleaving by replacing information packets in positions corresponding to variable nodes forming minimum stopping sets, with known packets, even when there is erasure in positions in the minimum stopping sets, re-padding section 161 on the decoding side re-pads lost packets, so that it is possible to avoid failure of erasure correction due to the minimum stopping sets.

(Another Example of Interleaving Processing)

Further, interleaving section 122 according to Embodiment 1 of the present invention may perform interleaving by means of the following processings.

(1) All minimum stopping sets included in the parity check matrix H are extracted.

(2) How many minimum stopping sets of all combinations of minimum stopping sets include each variable node corresponding to an organizing packet sequence, is checked.

(3) Each variable node corresponding to the organizing packet sequence is reordered in order from a variable node included in a greater number of minimum stopping sets to create a variable node list.

(4) The packet of a variable node corresponding to the first place in the variable node list is replaced with the packet at the tail of the organizing packet sequence P12, that is, a padding packet.

(5') Variable nodes included in minimum stopping sets including the variable node in the first place are removed from the variable node list. The packet of the variable node corresponding to the top in the variable node list subjected to removal is replaced with the second packet from the tail of the organizing packet sequence, that is, replaced with a padding packet.

(6') Subsequently, the variable nodes included in minimum stopping sets including the variable node corresponding to the top in the variable node list are removed and the packet of the variable node corresponding to the top in the variable node list subjected to removal is replaced with a padding packet of the organizing packet sequence to perform interleaving processing.

By so doing, a padding packet is arranged in the position of at least one of variable nodes forming minimum stopping sets. By this means, even when the number of packets that are lost on communication channel 140 is great, the decoding side can re-pad a known packet in a position of at least one of variable nodes forming a minimum stopping set, so that it is possible to avoid failure of erasure correction due to the minimum stopping set.

Note that processings (1) to (3) of the above interleaving processing needs not to be performed every interleaving processing and every coding processing, and, for example, interleaving section 122 may perform only processings (4), (5') and ('6) by performing processings (1) to (3) in advance and storing the result in erasure correction coding parameter memory section 124.

Further, although a case has been explained so far where the position to add a padding packet in padding section 121 is the rear portion of an information packet sequence, the present invention is not limited to this, and, instead of the rear portion, the position to add the padding packet may be the head or the middle of an information packet sequence as long as this position is known between the encoding side and the decoding side. For example, when padding section 121 adds a padding packet to the head of an information packet sequence, interleaving section 122 may perform interleaving processing using an interleaving pattern of replacing a packet corresponding to the top in the variable node list, with the packet at the front head of an organizing packet sequence. When padding section 121 adds a padding packet to the middle of an information packet sequence, interleaving section 122 sequentially replaces packets in the middle of the information sequence in the same way, with packets of variable nodes described in the variable node list.

Further, although a case has been explained with the present embodiment where the parity check matrix H shown in equation 1 is used, the parity check matrix H is not limited to the parity check matrix shown in equation 1, and, even when other parity check matrices are used, it is possible to provide the same advantage by using the present invention.

Furthermore, with the present embodiment, although erasure correction coding parameter memory section 124 stores the parity check matrix H, encoded packet length N, organizing packet length K, redundant packet length M and padding packet length P as LDPC code parameters, these parameters are by no means fixed and may be variable. By making the parity check matrix H, encoded packet length N, organizing packet length K and redundant packet length M variable, it is possible to support a plurality of LDPC codes. Consequently, the present invention is applicable to the system for switching the coding rate adaptively depending on the situation of communication such as the probability of erasure on a communication channel. Hereinafter, a erasure correction coding apparatus that supports a plurality of LDPC codes will be explained.

Figure 13:
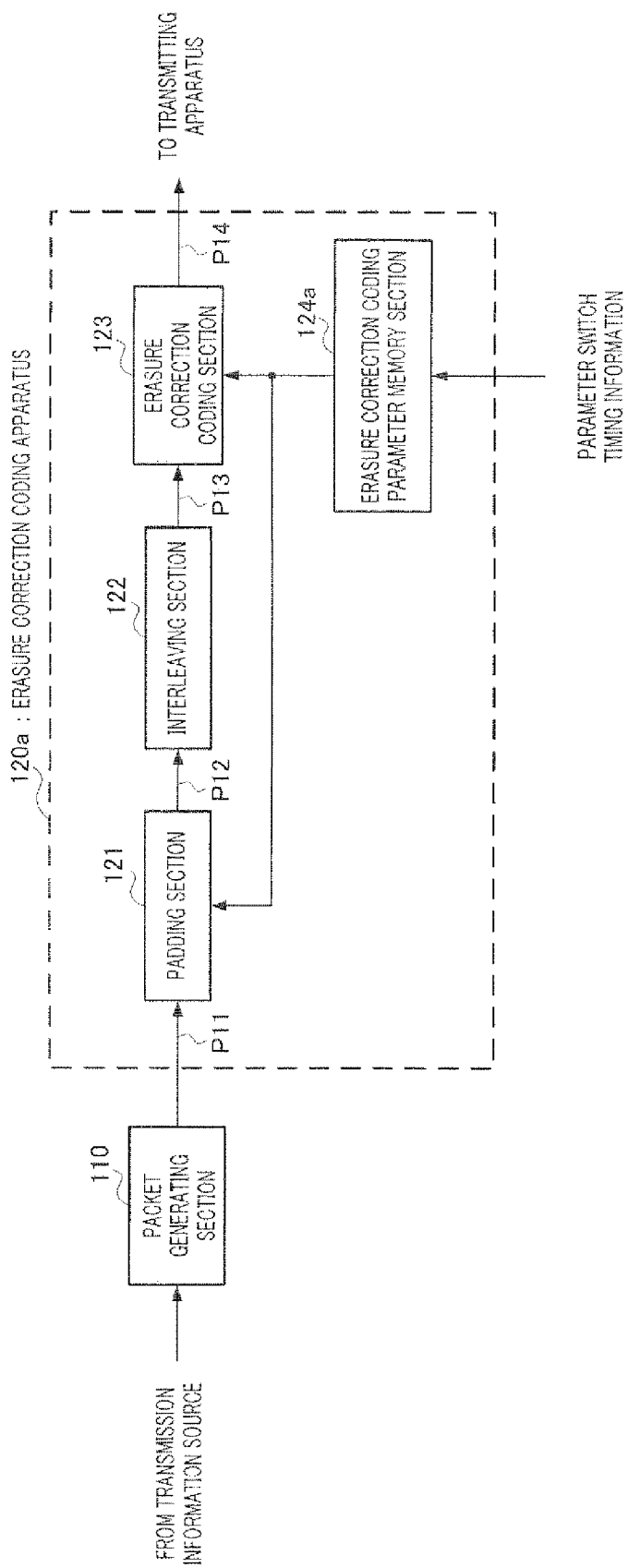
FIG. 13 is a block diagram showing another configuration example of the erasure correction coding apparatus according to Embodiment 1.

FIG. 13 shows a configuration example of erasure correction coding apparatus 120*a*. Note that the same components of erasure correction coding apparatus 120*a* of FIG. 13 as in FIG. 7 will be assigned the same reference numerals as in FIG. 7, and explanation thereof will be omitted. Erasure correction coding apparatus 120*a* of FIG. 13 differs from erasure correction coding apparatus 120 of FIG. 7 in having erasure correction coding parameter memory section 124*a* instead of erasure correction coding parameter memory section 124.

Erasure correction coding parameter memory section 124*a* stores a parameter set of a plurality of LDPC codes (i.e. parity check matrix H, encoded packet length N, organizing packet length K and redundant packet length M) used in the system to which erasure correction coding apparatus 120*a* is applied. Further, erasure correction coding parameter memory section 124*a* switches the LDPC code parameters to use, according to parameter switch timing information inputted from the outside of erasure correction coding apparatus 120*a*. As parameter switch timing information, an indicator to show the condition of the communication channel, an indicator to show that the transmission information source has changed and a parameter change request from the transmitting apparatus or the receiving apparatus, may be used. By this means, the parameters outputted to padding section 121 and erasure correction coding section 123 are switched. By so doing, erasure correction coding apparatus 120*a* can perform erasure correction coding processing using an arbitrary LDPC code.

Note that the padding packet length P varies according to the amount of data of the transmission information source. Therefore, in case where the transmission information source changes, for example, an indicator to show that the transmission information source has changed is outputted from the transmission information source to erasure correction coding parameter memory section 124*a*. Next, erasure correction coding parameter memory section 124*a* only needs to recalculate the padding packet length P based on the indicator.

(Another Configuration Example of the Erasure Correction Coding Apparatus)

In the above description, the erasure correction coding apparatus employs a configuration including an interleaving section that reorders an organizing packet sequence. Here, reordering an organizing packet sequence using interleaving processing is equivalent to reordering columns in the parity check matrix H of a erasure correction code. Therefore, the erasure correction coding parameter memory section first rearranges the order of columns in the parity check matrix H that is held, according to the number of padding packets. Next, the erasure correction coding section performs encoding based on the parity check matrix having the rearranged columns. The erasure correction coding apparatus having the above configuration can provide the advantage of the present invention without providing an interleaving section.

Figure 14:
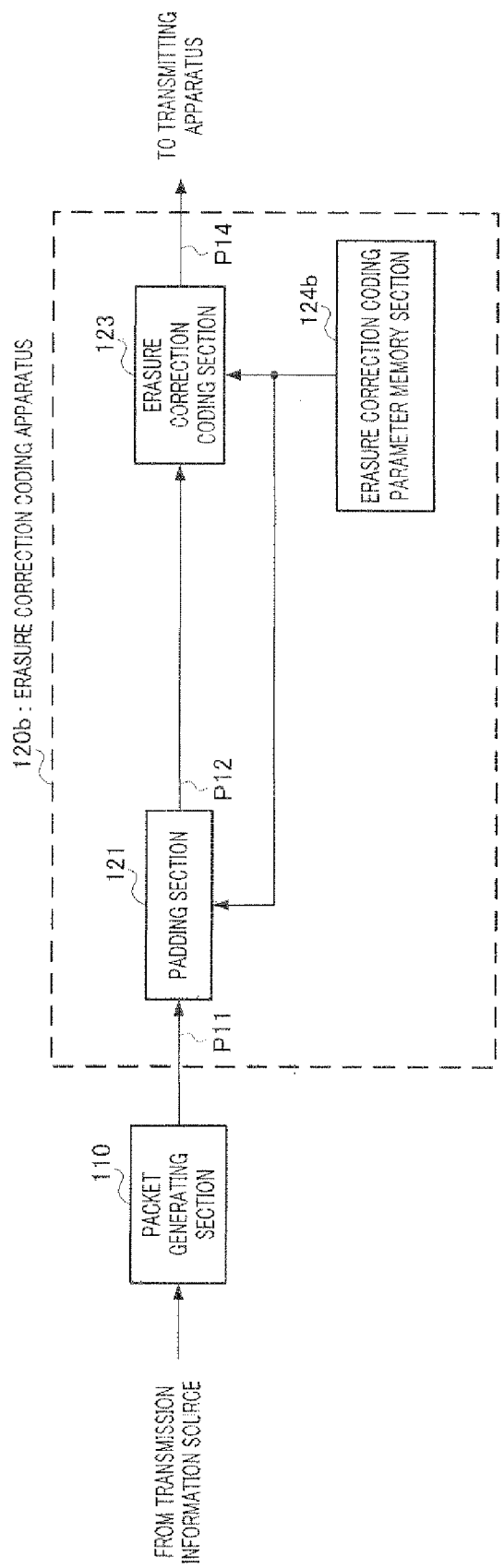
FIG. 14 is a block diagram showing another configuration example of the erasure correction coding apparatus according to Embodiment 1.

FIG. 14 shows a configuration example of the erasure correction coding apparatus in this case. Note that the same components of erasure correction coding apparatus 120*b* of FIG. 14 as in FIG. 7 will be assigned the same reference numerals as in FIG. 7, and explanation thereof will be omitted. Erasure correction coding apparatus 120*b* of FIG. 14 differs from erasure correction coding apparatus 120 of FIG. 7 in removing interleaving section 122 and having erasure correction coding parameter memory section 124*b* instead of erasure correction coding parameter memory section 124.

Erasure correction coding parameter memory section 124*b* rearranges the columns in the parity check matrix H shown in equation 1 such that a padding packet becomes one of variable nodes forming the minimum stopping set when P=2 (where P is the padding packet length), and outputs the parity check matrix $H_{perm}$ having the rearranged columns, to erasure correction coding section 123. For example, in case of P=2, the parity check matrix $H_{perm}$ having the rearranged columns, is determined according to equation 3.

[3]

$$H_{perm} = \begin{pmatrix} 1 & 1 & 1 & 0 & 1 & 1 & 1 & 0 & 0 & 0 \\ 1 & 1 & 0 & 0 & 1 & 0 & 0 & 1 & 1 & 1 \\ 1 & 1 & 0 & 1 & 0 & 0 & 1 & 0 & 1 & 1 \\ 0 & 0 & 1 & 1 & 1 & 1 & 0 & 1 & 1 & 0 \\ 0 & 0 & 1 & 1 & 0 & 1 & 1 & 1 & 0 & 1 \end{pmatrix}$$ (Equation 3)

The parity check matrix $H_{perm}$ is obtained by switching the second column and fifth column in the parity check matrix H and further switching the third column and fourth column in the parity check matrix H. At this time, the minimum stopping sets in the parity check matrix $H_{perm}$ are as follows.

[4]

SS1=[1,5,9] (Equation 4-1)

SS2=[5,3,8] (Equation 4-2)

SS3=[2,5,9] (Equation 4-3)

SS4=[5,6,8] (Equation 4-4)

SS5=[3,4,7] (Equation 4-5)

SS6=[4,6,7] (Equation 4-6)

SS7=[4,8,9] (Equation 4-7)

The variable node 5 is one of variable nodes 1 to 5 corresponding to the organizing packet sequence and is included in the greatest number of minimum stopping sets out of the above seven minimum stopping sets (that is, the variable node 5 is included in four patterns out of the seven patterns). Further, the variable node 4 is included in the second greatest number of minimum stopping sets (that is, the variable node 4 is included in three patterns out of the seven patterns).

Accordingly, even if interleaving section 122 is not provided, a padding packet is assigned to the variable node 5 which is one of the variable nodes 1 to 5 corresponding to the organizing packet sequence and which is included in the greatest number of minimum stopping sets, or to variable node 4 which is one of the variable nodes 1 to 5 corresponding to the organizing packet sequence. Therefore, even if, on communication channel 140, there is erasure in the positions in the minimum stopping set, re-padding section 161 can perform re-padding, so that it is possible to avoid failure of erasure correction due to the minimum stopping set.

Further, erasure correction decoding parameter memory section 164 of erasure correction decoding apparatus 160 on the receiving side outputs the parity check matrix $H_{perm}$ having the rearranged columns, to erasure correction decoding section 162, so that erasure correction decoding apparatus 160 shown in FIG. 8 can be configured without deinterleaving section 163.

Embodiment 2

Embodiment 2 of the present invention discloses a communication apparatus on the encoding side and a communication apparatus on a decoding side in a communication system that punctures and depunctures redundant packets to adjust the coding rate of a erasure correction code. Embodiment 2 differs from Embodiment 1 mainly in performing puncturing instead of padding, and applying interleaving processing after erasure correction coding processing.

Figure 15:
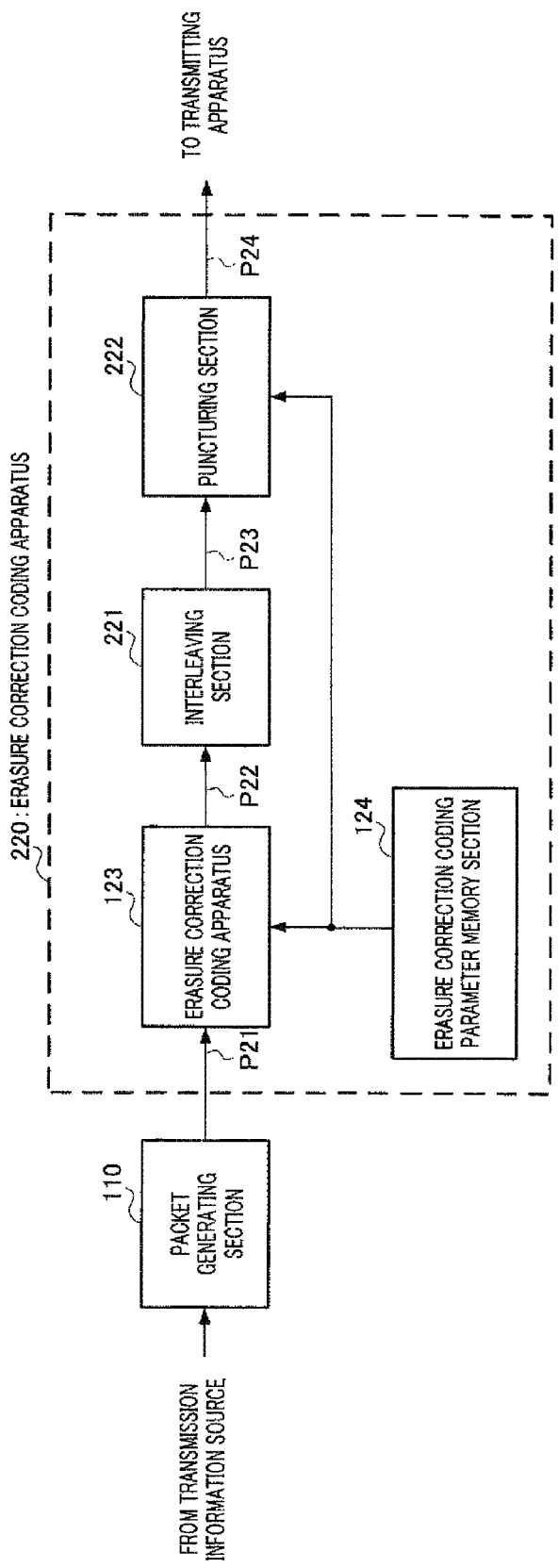
FIG. 15 is a block diagram showing the configuration of main parts of the erasure correction coding apparatus according to Embodiment 2 of the present invention.

FIG. 15 shows the configuration of main parts of the erasure correction coding apparatus according to Embodiment 2. Note that, in FIG. 15, the same components as in FIG. 7 will be assigned the same reference numerals and explanation thereof will be omitted. Erasure correction coding apparatus 220 of FIG. 15 is formed with erasure correction coding section 123, interleaving section 221, puncturing section 222 and erasure correction coding parameter memory section 124. Further, similar to Embodiment 1, a case will be explained below as an example where erasure correction coding apparatus 220 performs erasure correction coding in units of J information packets.

Interleaving section 221 performs interleaving processing of reordering the redundant packet sequence of the encoded packet sequence resulting from erasure correction coding. Further, interleaving processing will be described later.

Puncturing section 222 punctures part of packets of the redundant packet sequence that is reordered in interleaving section 221, according to the puncturing pattern held in erasure correction coding parameter memory section 124. Further, puncturing processing will be described later.

Figure 16:
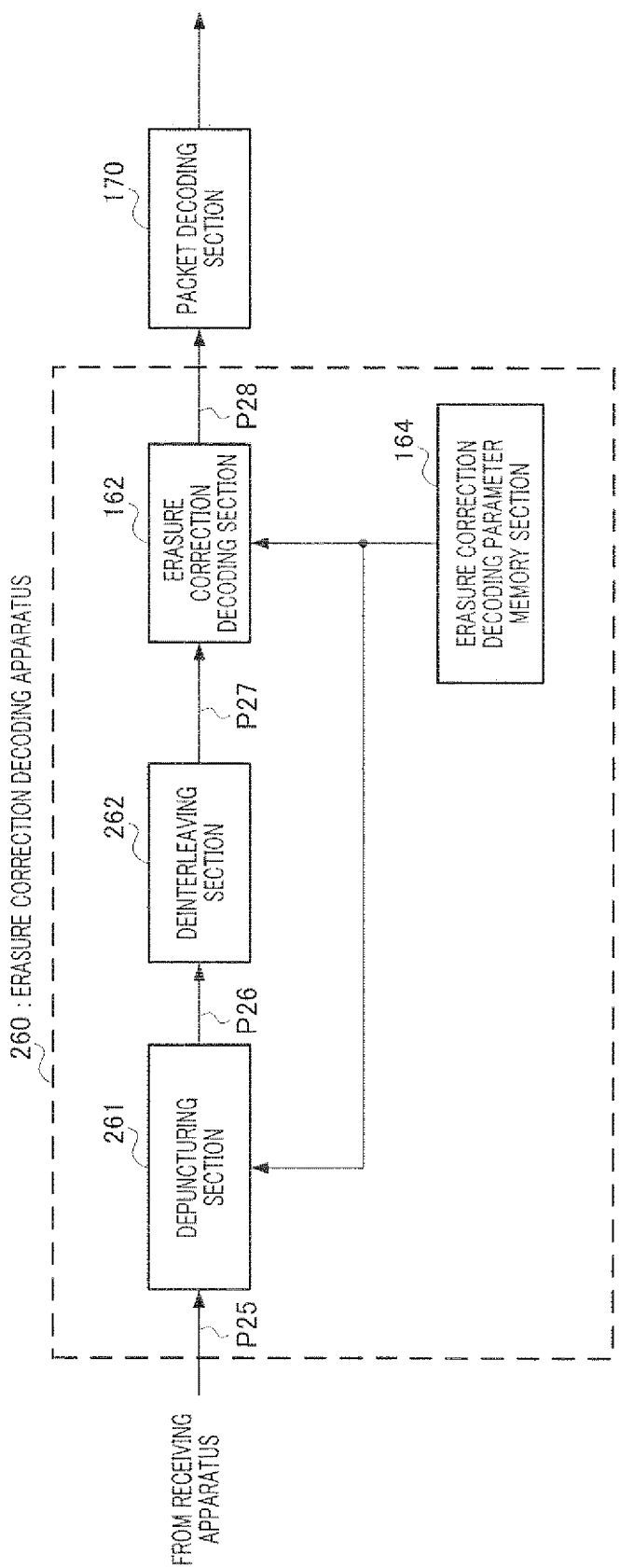
FIG. 16 is a block diagram showing the configuration of main parts of the erasure correction decoding apparatus according to Embodiment 2.

FIG. 16 is a block diagram showing the configuration of main parts of erasure correction decoding apparatus 260 according to Embodiment 2. Note that, in FIG. 16, the same components as in FIG. 8 will be assigned the same reference numerals and explanation thereof will be omitted. Erasure correction decoding apparatus 260 is formed with depuncturing section 261, deinterleaving section 262, erasure correction decoding section 162 and erasure correction decoding parameter memory section 164.

Depuncturing section 261 inserts a null packet to the position corresponding to a variable node that is punctured on the encoding side. To be more specific, depuncturing section 261 forms the encoded packet sequence assuming that the punctured packet is a lost packet, and outputs the generated encoded packet sequence to deinterleaving section 262.

Deinterleaving section 262 performs reverse reordering processing of the reordering processing performed in interleaving section 221 on the encoding side.

The operations of erasure correction coding apparatus 220 and erasure correction decoding apparatus 260 formed as described above will be explained below. Note that a case will be explained as an example where, assuming that the parity check matrix H defines an LDPC code used as a erasure correction code, erasure correction coding/decoding is performed using the matrix shown in equation 1 similar to Embodiment 1.

(Operation of the Erasure Correction Coding Apparatus)

FIG. 17A shows an information packet sequence P21 formed with five packets outputted from packet generating section 110. Further, the same reference numerals as the corresponding packet sequences of FIG. 15 will be assigned in FIG. 17.

Erasure correction coding section 123 generates a redundant packet sequence based on the parity check matrix H held in erasure correction coding parameter memory section 124, and generates a redundant packet sequence. Further, erasure correction coding section 123 outputs the encoded packet sequence P22 obtained by adding the redundant packet sequence to the information packet sequence, to interleaving section 221. FIG. 17B shows the encoded packet sequence P22.

Interleaving section 221 performs reordering (i.e. interleaving) processing of the redundant packet sequence of the encoded packet sequence P22 outputted from erasure correction coding section 123. Interleaving processing will be explained using FIG. 18 and FIG. 19.

Figure 18:
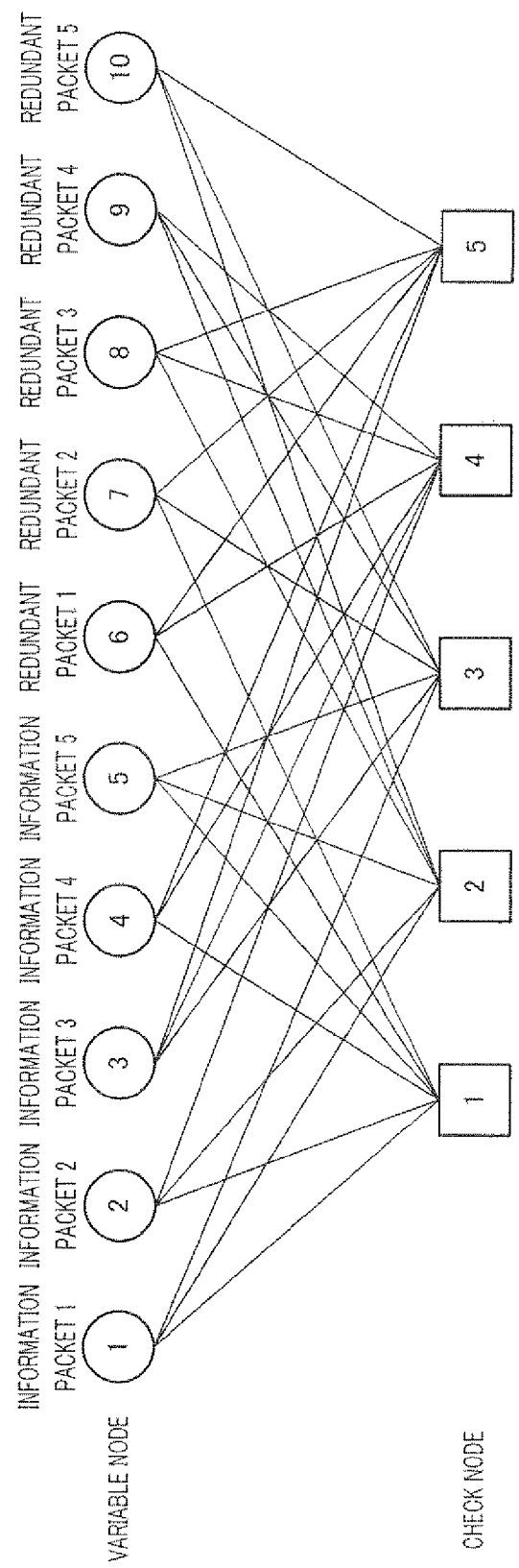
FIG. 18 shows a parity check matrix H using a Tanar graph.

FIG. 18 shows a Tanner graph matching the parity check matrix H of equation 1. With the present embodiment, the variable nodes 1 to 5 correspond to the information packet sequence, and the variable nodes 6 to 10 correspond to the redundant packet sequence resulting from erasure correction coding. A packet matching each variable node is shown above each variable node in FIG. 18.

Figure 19:
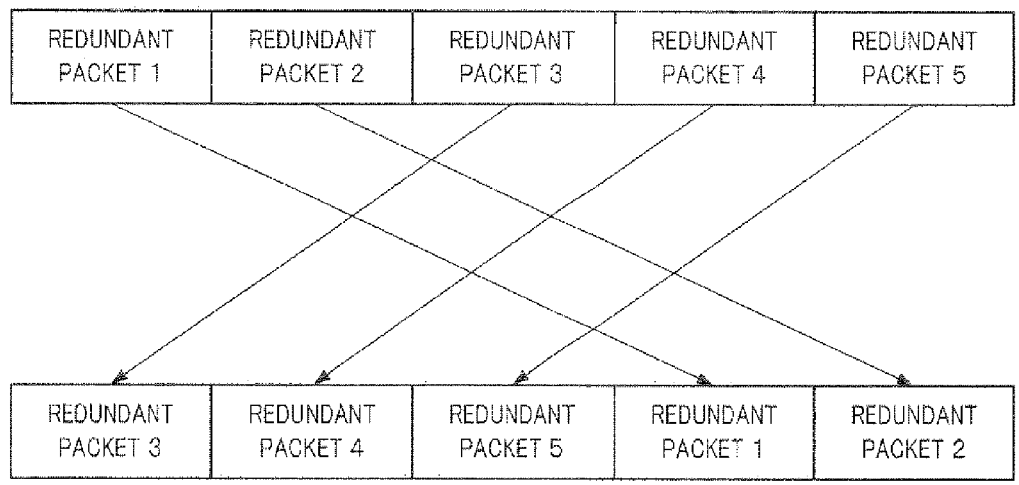
FIG. 19 shows an example of an interleaving pattern according to Embodiment 2.

FIG. 19 shows an example of an interleaving pattern in interleaving section 221. With the example shown in FIG. 19, an interleaving pattern takes a pattern cyclically shifting the order of redundant packets rightward three times. Interleaving section 221 adds the interleaved redundant packet sequence to the information packet sequence, and outputs the encoded packet sequence P23 to which the redundant packet sequence has been added, to puncturing section 222 (see FIG. 17C).

Figure 20:
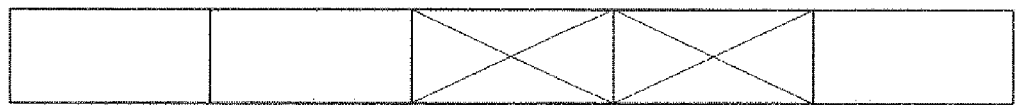
FIG. 20 shows an example of a puncturing pattern according to Embodiment 2.

Puncturing section 222 punctures the redundant packet sequence of the encoded packet sequence P23, based on the puncturing pattern held in erasure correction coding parameter memory section 124. FIG. 20 shows an example of a puncturing pattern in puncturing section 222. With the example shown in FIG. 20, the third and fourth redundant packets are cut off by puncturing. Accordingly, puncturing section 222 punctures redundant packets 1 and 5 of the encoded packet sequence P23. FIG. 17D shows the punctured encoded packet sequence P24. The punctured encoded packet sequence P24 corresponds to the packet sequence to which an LDPC code of the coding rate 5/8 is applied. Puncturing section 222 outputs the punctured encoded packet sequence P24 to transmitting apparatus 130.

The redundant packets 1 and 5 that are punctured at this time are redundant packets corresponding to the variable nodes 6 and 10 as shown in FIG. 18. As is clear from equation 2-1 to equation 2-7 presented above, there are two minimum stopping sets (SS4 and SS6) that include the variable node 6 and no minimum stopping sets that include the variable node 10.

By contrast with this, in case where erasure correction coding apparatus 220 does not have interleaving section 221, puncturing section 222 punctures redundant packets 3 and 4 of the encoded packet sequencer P22. The redundant packets 3 and 4 correspond to the variable nodes 8 and 9. As is clear from equation 2-1 to equation 2-7, there are three minimum stopping sets (SS2, SS4 and SS7) that include the variable node 8 and three minimum stopping sets (SS1, SS3 and SS7) that include the variable node 9. Accordingly, compared to the case where interleaving processing is performed prior to puncturing processing, if interleaving processing is not performed, cases might occur where variable nodes corresponding to redundant packets punctured in puncturing section 222 are included in a greater number of minimum stopping sets.

Therefore, in case where interleaving processing is not performed, if a redundant packet corresponding to a variable node included in a greater number of minimum stopping sets is punctured, decoding performance of erasure correction decoding processing that is performed on the decoding side deteriorates.

Consequently, with the present embodiment, interleaving section 221 replaces a redundant packet corresponding to a variable node included in a smaller number of minimum stopping sets, with the position to be punctured by puncturing section 222.

By so doing, it is possible to prevent redundant packets corresponding to variable nodes included in a greater number of minimum stopping sets, from being punctured by puncturing section 222 and, consequently, suppress the influence of puncturing upon decoding performance.

(Operation of the Erasure Correction Decoding Apparatus)

FIG. 21 shows packet sequences inputted in and outputted from each section of erasure correction decoding apparatus 260. Further, the same reference numerals as the corresponding packet sequences of FIG. 16 will be assigned in FIG. 21.

Figures 21A, 21B, 21C, 21D:
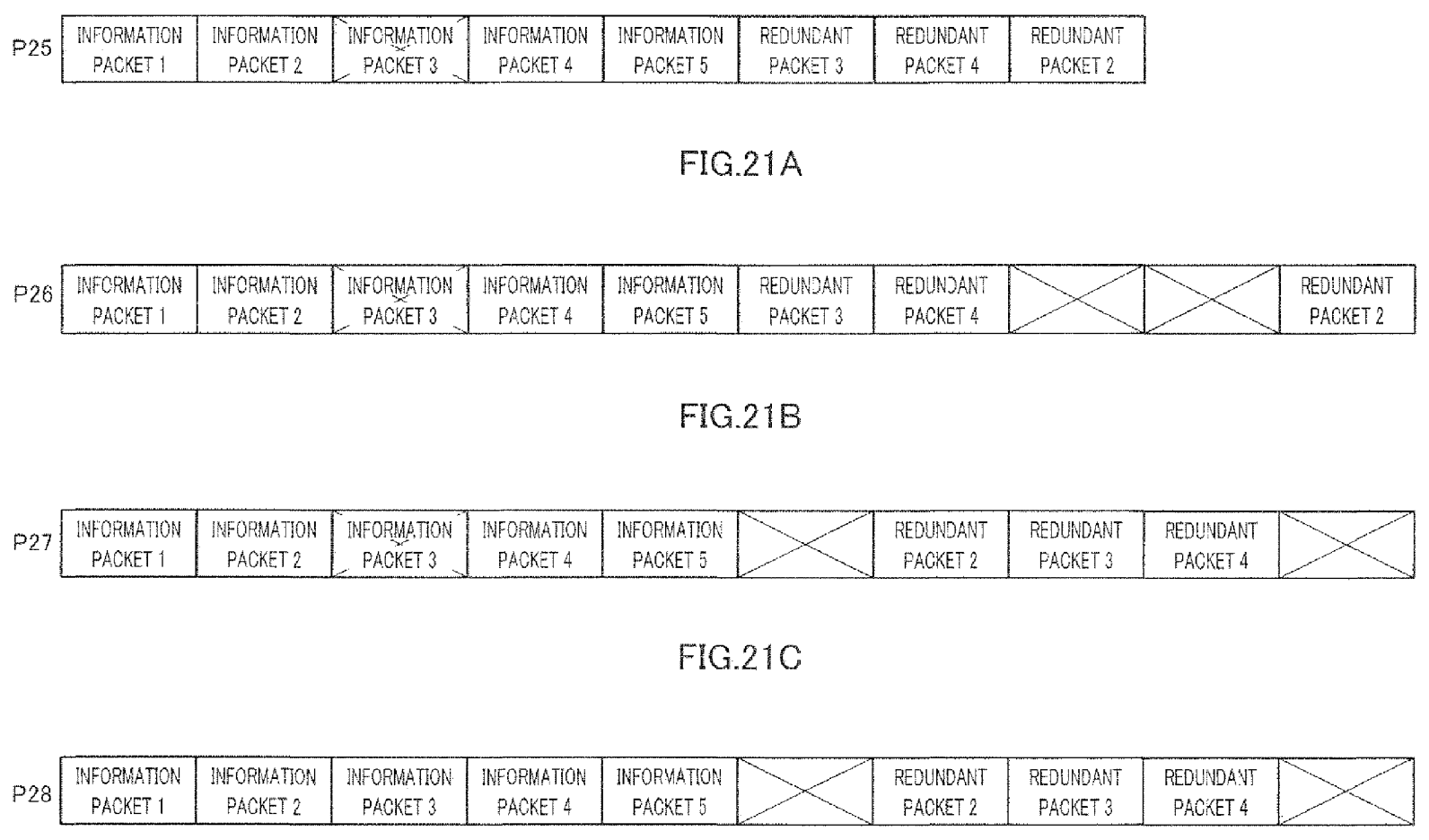

FIG. 21A shows the received encoded packet sequence P25 outputted from receiving apparatus 150. A case will be explained below assuming that, in FIG. 21A, the information packet 3 to which "x" symbol is assigned is lost on communication channel 140.

Depuncturing section 261 inserts null packets in packet positions that are punctured, based on the puncturing pattern (see FIG. 20) held in erasure correction decoding parameter memory section 164. FIG. 21B shows the depunctured encoded packet sequence P26.

Figure 22:
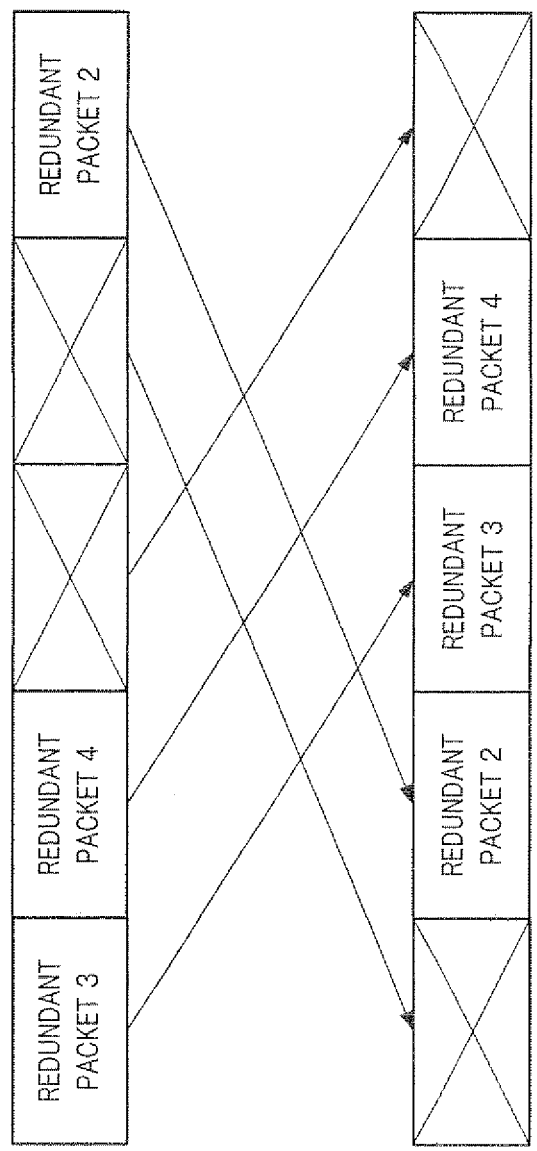
FIG. 22 shows an example of a deinterleaving pattern according to Embodiment 2.

Deinterleaving section 262 performs reverse processing of the reordering processing performed in interleaving section 221 on the encoding side. FIG. 22 shows the deinterleaving pattern in deinterleaving section 262. The deinterleaving pattern of FIG. 22 is used to perform reverse processing of the interleaving processing of FIG. 19, and is directed to shifting a redundant packet sequence leftward three times. FIG. 21C shows the deinterleaved encoded packet sequence P27. Deinterleaving section 262 outputs the deinterleaved encoded packet sequence P27 to erasure correction decoding section 162.

Erasure correction decoding section 162 performs erasure correction decoding processing to restore the lost information packet 3, and outputs the packet sequence P28 subjected to erasure correction decoding (see FIG. 21D), to packet decoding section 170.

As described above, according to the present embodiment, erasure correction coding apparatus 220 provides interleaving section 221 before puncturing section 222, and interleaving section 221 preferentially assigns a redundant packet corresponding to the variable node included in a smaller number of minimum stopping sets, to the position punctured by puncturing section 222. By this means, it is possible to reduce the probability that packet erasure recurs in minimum stopping sets due to puncturing, and, consequently, improve the performance of a erasure correction code in the communication system.

Further, although a case has been explained above as an example where interleaving section 221 cyclically shifts a redundant packet sequence rightward three times, and, in response to this, deinterleaving section 262 cyclically shifts the redundant packet sequence leftward three times, the present invention is not limited to these interleaving/deinterleaving patterns, and the advantage of the present invention can be acquired from interleaving patterns and deinterleaving patterns supporting these interleaving patterns for preventing redundant packets corresponding to variable nodes included in a greater number of minimum stopping sets, from being punctured.

Other Configuration Examples

Although a case has been explained above where erasure correction coding/decoding is performed using erasure correction coding apparatus 220 shown in FIG. 15 and erasure correction decoding apparatus 260 shown in FIG. 16, the present invention is not limited to the above configuration. For example, the erasure correction coding apparatus shown in FIG. 23 and the erasure correction decoding apparatus shown in FIG. 24 may be used.

Figure 23:
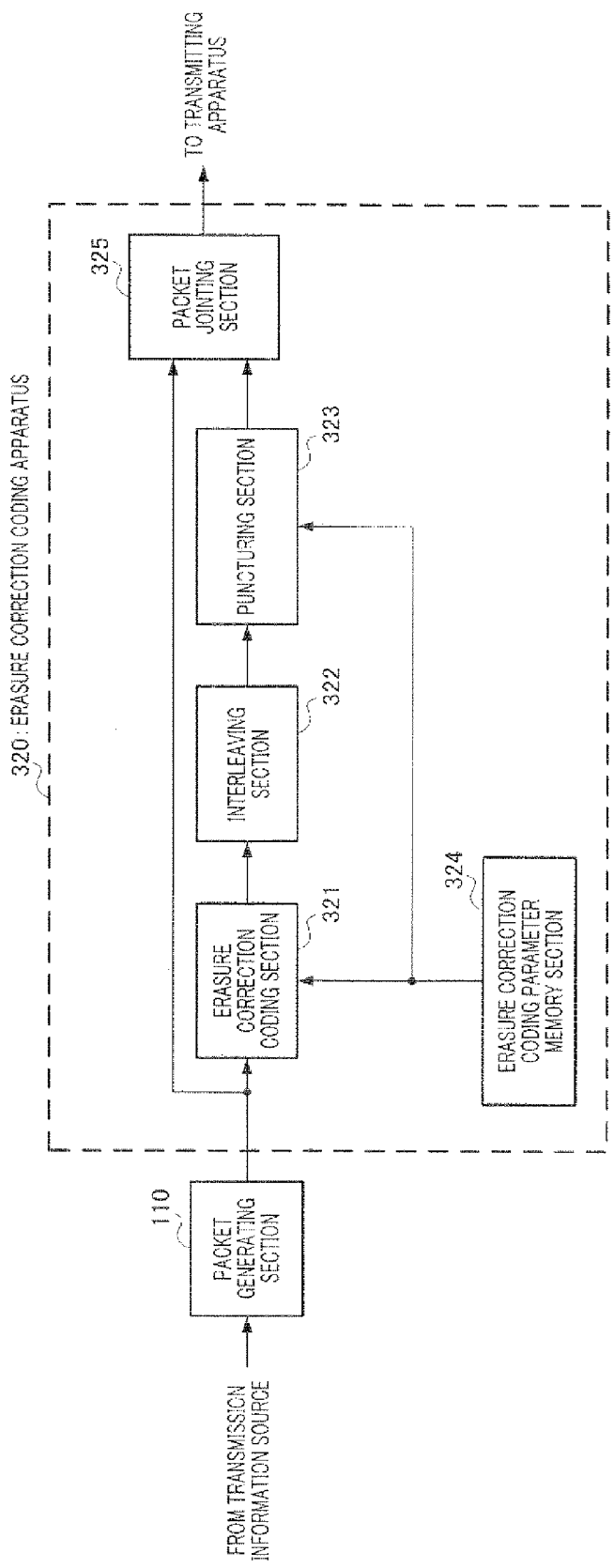
FIG. 23 is a block diagram showing another configuration of main parts of the erasure correction coding apparatus according to Embodiment 2.

FIG. 23 shows another configuration example of the erasure correction coding apparatus according to the present embodiment. Erasure correction coding apparatus 320 in FIG. 23 is formed with erasure correction coding section 321, interleaving section 322, puncturing section 323, erasure correction coding parameter memory section 324 and packet jointing section 325.

Erasure correction coding section 321 performs erasure correction coding processing of an organizing packet outputted from packet generating section 110, based on a parity check matrix held in erasure correction coding parameter memory section 324. Erasure correction coding section 321 outputs the redundant packet sequence resulting from encoding processing, to interleaving section 322.

Interleaving section 322 performs interleaving processing of the redundant packet sequence outputted from erasure correction coding section 321. Interleaving section 322 outputs the redundant packet sequence subjected to the interleaving processing, to puncturing section 323.

Puncturing section 323 punctures the interleaved redundant packet sequence, according to the puncturing pattern held in erasure correction coding parameter memory section 324. Puncturing section 323 outputs the punctured packet sequence to packet jointing section 325.

Packet jointing section 325 joints the punctured packet sequence to the rear portion of the organizing packet sequence, and outputs the organizing packet sequence to transmitting apparatus 130.

In this way, packet jointing section 325 is provided to combine an information packet sequence and redundant packet sequence, so that interleaving section 322 and puncturing section 323 require a short memory length compared to interleaving section 221 and puncturing section 222, and, consequently, it is possible to reduce the circuit scale in erasure correction coding apparatus 320 compared to erasure correction coding apparatus 220.

Figure 24:
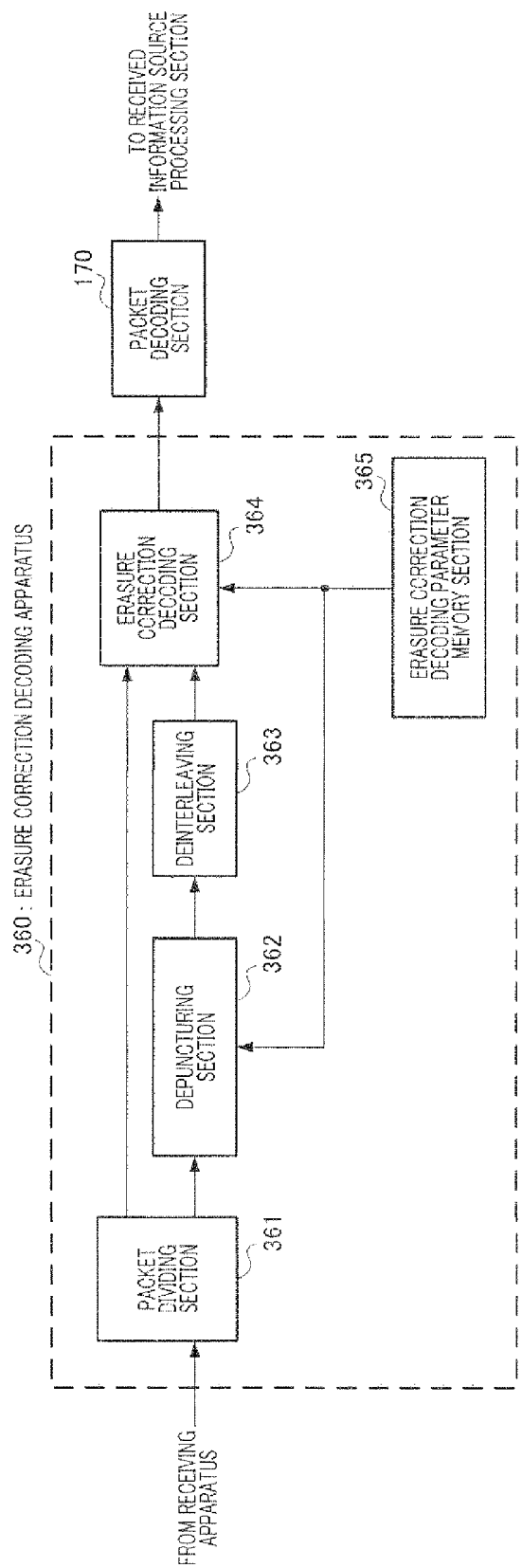
FIG. 24 is a block diagram showing another configuration of main parts of the erasure correction decoding apparatus according to Embodiment 2.

FIG. 24 shows another configuration example of the erasure correction decoding apparatus according to the present embodiment. Erasure correction decoding apparatus 360 in FIG. 24 is formed with packet dividing section 361, depuncturing section 362, deinterleaving section 363, erasure correction decoding section 364 and erasure correction decoding parameter memory section 365.

Packet dividing section 361 divides the received packet sequence into a portion corresponding to the organizing packet sequence and a portion corresponding to the redundant packet sequence. Packet dividing section 361 outputs a packet sequence corresponding to the organizing packet sequence, to erasure correction decoding section 364, and outputs a packet sequence corresponding to the redundant packet sequence, to depuncturing section 362.

Depuncturing section 362 performs depuncturing processing of the redundant packet sequence, based on the depuncturing pattern held in erasure correction decoding parameter memory section 365. Depuncturing section 362 outputs the depunctured redundant packet sequence (i.e. depuncture packet sequence) to deinterleaving section 363.

Deinterleaving section 363 performs deinterleaving processing of the depunctured packet sequence. Deinterleaving section 363 outputs the deinterleaved packet sequence to erasure correction decoding section 364.

Erasure correction decoding section 364 joints the organizing packet sequence outputted from packet dividing section 361 and the deinterleaved packet sequence outputted from deinterleaving section 363, and performs erasure correction decoding processing of the jointed packet sequence, based on the parity check matrix H held in erasure correction decoding parameter memory section 365. Erasure correction decoding section 364 outputs the packet sequence subjected to erasure correction decoding, to packet decoding section 170.

In this way, packet dividing section 361 is provided to depuncture/deinterleave only a redundant packet sequence, so that depuncturing section 362 and deinterleaving section 363 require a short memory length compared to depuncturing section 261 and deinterleaving section 262, and, consequently, it is possible to reduce the circuit scale of erasure correction decoding apparatus 360 compared to erasure correction decoding apparatus 260.

Further, although a case has been explained with the present embodiment where redundant packets are punctured and depunctured to adjust the coding rate of a erasure correction code, the present invention is not limited to this and is applicable to the case where information packets are punctured and depunctured and the case where information packets and redundant packets are punctured and depunctured. In this case, interleaving section 221 only needs to interleave the order in a packet sequence such that puncturing section 222 preferentially punctures information packets or redundant packets corresponding to variable nodes included in a smaller number of minimum stopping sets.

Embodiment 3

Embodiment 3 of the present invention discloses a case where the above configuration of providing the interleaving section between the erasure correction coding section and the puncturing section as disclosed in Embodiment 2, is applied to a communication apparatus that performs error correction coding per bit. Although a ease has been explained with Embodiment 2 where erasure correction coding, puncturing and interleaving are performed in packet units, erasure correction coding, puncturing and interleaving are performed in bit units with the present embodiment.

Figure 25:
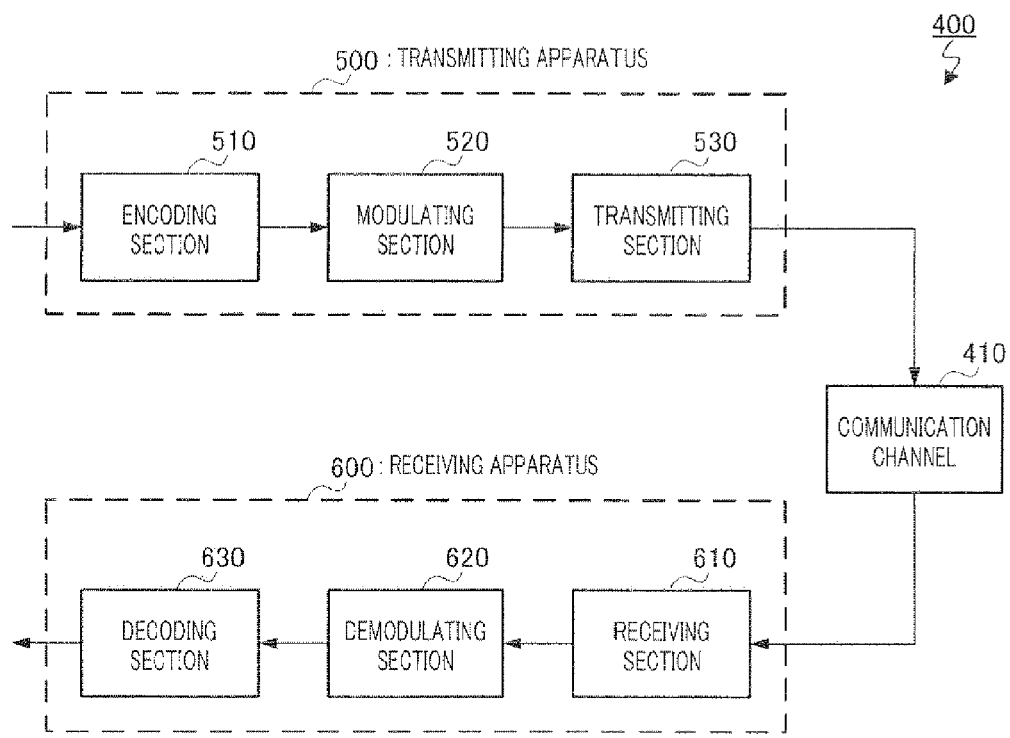
FIG. 25 shows an overall configuration of the communication system according to Embodiment 3 of the present invention.

FIG. 25 shows a configuration example of a communication system according to Embodiment 3 of the present invention. Communication system 400 in FIG. 25 is formed with transmitting apparatus 500, communication channel 410 and receiving apparatus 600.

Transmitting apparatus 500 is formed with encoding section 510, modulating section 520 and transmitting section 530. Further, receiving apparatus 600 is formed with receiving section 610, demodulating section 620 and decoding section 630.

Encoding section 510 performs error correction coding processing of the information bit sequence, and generates a bit sequence by adding redundancy to the original information bit sequence (i.e. encoded bit sequence). Encoding section 510 outputs the encoded bit sequence to modulating section 520.

Modulating section 520 performs digital modulation processing, which is required to transmit the encoded bit sequence on communication channel 410, with respect to the encoded bit sequence. Digital modulation processing includes channel interleaving and digital modulation, and might also includes spreading, multicarrier modulation, precoding and multiplexing, depending on systems. Modulating section 520 outputs a modulated signal to transmitting section 530.

Transmitting section 530 performs analogue modulation processing such as D/A (Digital to Analogue) conversion, frequency conversion, filtering, and waveform shaping, with respect to the modulated signal, and transmits a transmission signal to communication channel 410.

Communication channel 410 is the communication route through which a signal transmitted from transmitting apparatus 500 travels until it is received by receiving apparatus 600. As communication channels, Ethernet (registered trademark), electric wires, metal cables, optical fibers, radio, light (e.g. visible light or infrared light) and combinations of these may be used.

Receiving section 610 performs analogue demodulation processing such as A/D (Analogue to Digital) conversion, frequency conversion, filtering and waveform shaping, with respect to the signal received through communication channel 410, and outputs the resulting received baseband signal to demodulating section 620.

Demodulating section 620 performs digital demodulation processing such as equalization, digital demodulation, deinterleaving, despreading and multicarrier demodulation, with respect to the received baseband signal, finds probabilities as to whether the encoded bit transmitted is one or zero and outputs the sequence formed based on the probabilities, that is, the likelihood sequence, to decoding section 630. Generally, the ratio (i.e. log likelihood ratio) of the value that adopts the logarithm of the probability that the encoded bit is one and the value that adopts the logarithm of the probability that the encoded bit is zero, is used as a likelihood sequence.

Decoding section 630 performs error correction decoding processing of the likelihood sequence resulting from demodulation, and acquires the received bit sequence.

Figure 26:
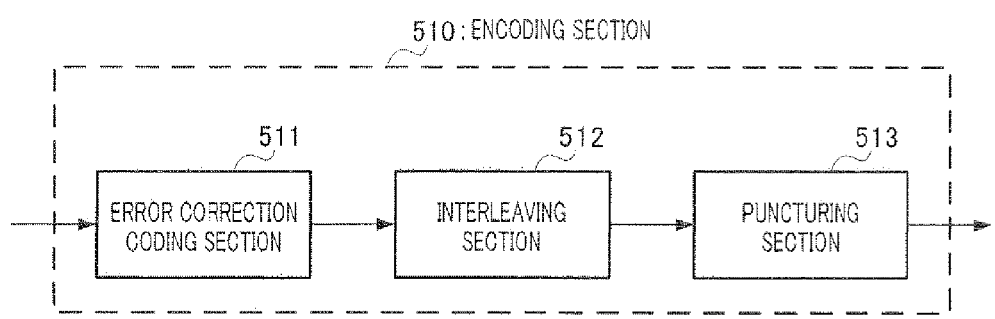
FIG. 26 shows a configuration example of an encoding section according to Embodiment 3.

FIG. 26 is a block diagram showing the configuration of encoding section 510. Encoding section 510 in FIG. 26 is formed with error correction coding section 511, interleaving section 512 and puncturing section 513.

Error correction coding section 511 performs LDPC coding of the input bit sequence, and outputs the resulting encoded bit sequence to interleaving section 512.

Interleaving section 512 reorders the bits of the encoded bit sequence, and outputs the reordered encoded bit sequence (i.e. interleaved bit sequence), to puncturing section 513.

Puncturing section 513 removes a bit in the order determined in advance, from the interleaved bit sequence, and outputs only the rest of the interleaved bits to modulating section 520.

Figure 27:
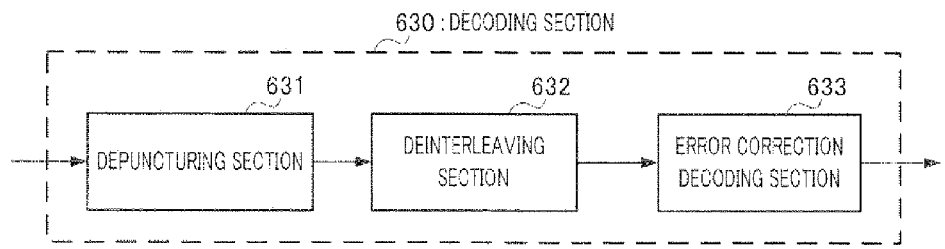
FIG. 27 shows a configuration example of a decoding section according to Embodiment 3.

FIG. 27 is a block diagram showing the configuration of decoding section 630. Decoding section 630 in FIG. 27 is formed with depuncturing section 631, deinterleaving section 632 and error correction decoding section 633.

Depuncturing section 631 inserts a depuncture value in the predetermined position in the likelihood sequence outputted from demodulating section 620. In case where a log likelihood ratio is used as a likelihood sequence, zero is used as the depuncture value. Depuncturing section 631 outputs the depunctured likelihood sequence to deinterleaving section 632.

Deinterleaving section 632 performs reverse processing of the interleaving performed on the encoding side, with respect to the depunctured likelihood sequence, and outputs the deinterleaved likelihood sequence to error correction decoding section 633.

Error correction decoding section 633 performs error correction decoding processing of the deinterleaved likelihood sequence, and outputs the bit sequence resulting from error correction decoding.

The operations of encoding section 510 and decoding section 630 in the communication system formed as described above, will be mainly explained below.

Assuming that the information bit sequence is $b(i)(i=1, \ldots, K)$, error correction coding section 511 generates a redundant bit sequence $p(i)(i=1, \ldots, M)$ using $b(i)$ and the parity check matrix H that defines an LDPC code. Error correction coding section 511 joints p(i) to the tail of b(i), generates the encoded bit sequence c(i)=[b(1), . . . , b(K), p(1), . . . , p(M)] (i=1, . . . , N(=K+M)) and outputs the generated encoded bit sequence c(i) to interleaving section 512.

Interleaving section 512 reorders a sequence c(j)(j=K+1, . . . , N) corresponding to the redundant sequence of the encoded bit sequence c(i). As explained in Embodiment 2 of the present invention, interleaving section 512 performs interleaving based on variable nodes forming minimum stopping sets in the parity check matrix H. As an example, interleaving section 512 performs interleaving such that redundant bits included in a greater number of minimum stopping sets are not removed due to puncturing. The interleaving pattern in this case is determined in advance based on the parity check matrix H used in error correction coding and the puncturing pattern adopted in puncturing section 513. Interleaving section 512 outputs the interleaved bit sequence ci(i)(i=1, . . . , N) acquired by interleaving the redundant bit sequence, to puncturing section 513.

Puncturing section 513 punctures part of the redundant bit sequence of the interleaved bit sequence ci(i). Puncturing section 513 outputs the punctured bit sequence cp(i)(i=1, . . . , T, K≦T≦N) resulting from puncturing, to modulating section 520.

As described above, according to the present embodiment, interleaving section 512 reorders the bit sequence subjected to error correction coding, based on variable nodes forming a minimum stopping set in the LDPC parity check matrix H, and puncturing section 513 punctures the interleaved bit sequence. To be more specific, in order from a variable node included in a smaller number of minimum stopping sets in the LDPC parity check matrix H, interleaving section 512 preferentially assigns a packet in a position corresponding to an applicable variable node, to the position to be punctured by puncturing section 513.

By so doing, it is possible to avoid deterioration in error correction decoding performance due to puncturing of redundant bits included in a greater number of minimum stopping sets, and, consequently, improve error correction performance in the communication system.

Another Configuration Example

Figure 28:
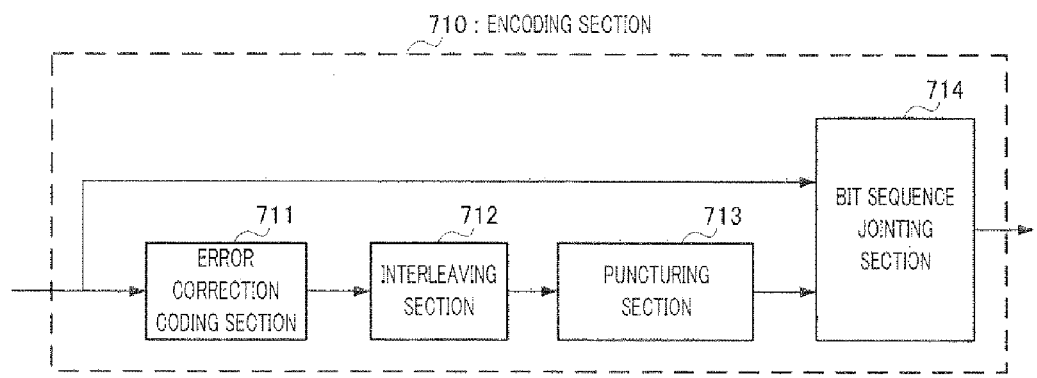
FIG. 28 shows another configuration example of an encoding section according to Embodiment 3.
Figure 29:
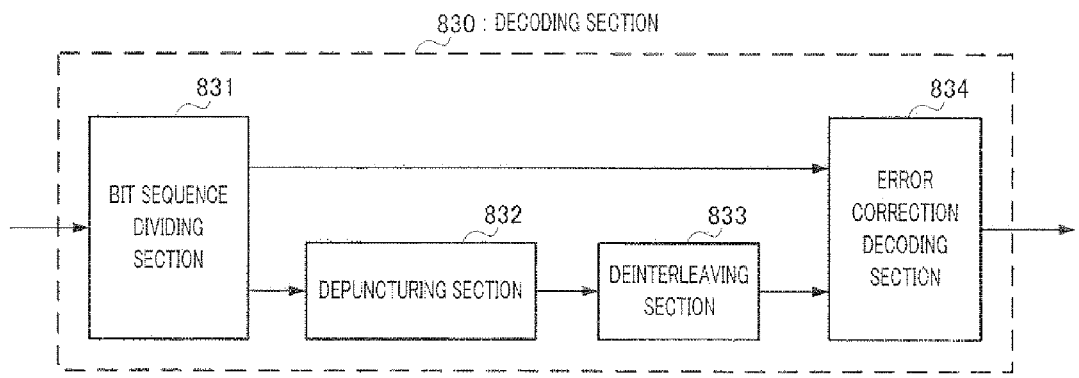
FIG. 29 shows another configuration example of a decoding section according to Embodiment 3.

Although a case has been explained above where error correction coding/decoding is performed using encoding section 510 shown in FIG. 26 and decoding section 630 shown in FIG. 27, the present invention is not limited to the above configuration and, for example, the encoding section shown in FIG. 28 and the decoding section shown in FIG. 29 may be used.

FIG. 28 shows another configuration example of the encoding section according to the present embodiment. Encoding section 710 in FIG. 28 has error correction coding section 711, interleaving section 712, puncturing section 713 and bit sequence jointing section 714.

Error correction coding section 711 performs error correction coding processing of an information bit sequence, based on a parity check matrix. Error correction coding section 711 outputs the redundant bit sequence resulting from encoding processing, to interleaving section 712.

Interleaving section 712 performs interleaving processing of the redundant bit sequence outputted from error correction coding section 711. Interleaving section 712 outputs the redundant bit sequence subjected to interleaving processing, to puncturing section 713.

Puncturing section 713 punctures the interleaved redundant bit sequence according to the puncturing pattern. Puncturing section 713 outputs the punctured bit sequence to bit sequence jointing section 714.

Bit sequence jointing section 714 joints the punctured bit sequence to the rear potion of the transmission bit sequence, and outputs the transmission bit sequence to modulating section 520.

FIG. 29 shows another configuration example of the decoding section according to the present embodiment. Decoding section 830 in FIG. 29 has bit sequence dividing section 831, depuncturing section 832, deinterleaving section 833 and error correction decoding section 834.

Bit sequence dividing section 831 divides the received bit sequence into a portion corresponding to the organizing bit sequence and a portion corresponding to the redundant bit sequence. Bit sequence dividing section 831 outputs the bit sequence corresponding to the organizing bit sequence, to error correction decoding section 834, and outputs the bit sequence corresponding to the redundant bit sequence, to depuncturing section 832.

Depuncturing section 832 depunctures the redundant bit sequence based on the depuncturing pattern. Depuncturing section 832 outputs the depunctured redundant bit sequence (i.e. depunctured bit sequence) to deinterleaving section 833.

Deinterleaving section 833 performs deinterleaving processing of the depunctured bit sequence. Deinterleaving section 833 outputs the deinterleaved bit sequence to error correction decoding section 834.

Error correction decoding section 834 joints the organizing bit sequence outputted from bit sequence dividing section 831 and the deinterleaved bit sequence outputted from deinterleaving section 833, and performs error correction decoding processing of the jointed bit sequence, based on the parity check matrix. Error correction decoding section 834 outputs the bit sequence subjected to error correction decoding.

By employing this configuration, it is possible to acquire the advantage of the present invention of avoiding deterioration in error correction decoding performance due to puncturing of redundant bits included in a greater number of minimum stopping sets.

Embodiment 4

With Embodiment 1, a erasure correction coding apparatus that adjusts the coding rate by means of padding has been explained. To be more specific, the erasure correction coding apparatus is configured to include an interleaving section and erasure correction coding section for assigning known packets to positions corresponding to variable nodes which are ones of variable nodes corresponding to an organizing packet sequence and which form a minimum stopping set, and for encoding the organizing packet sequence. With the present embodiment, a erasure correction coding apparatus that assigns known packets to positions corresponding to variable nodes which are ones of variable nodes corresponding to a redundant packet sequence and which form a minimum stopping set and that encodes the redundant packet sequence, and a erasure correction decoding apparatus that decodes the encoded redundant packet sequence, will be explained.

Figure 1:
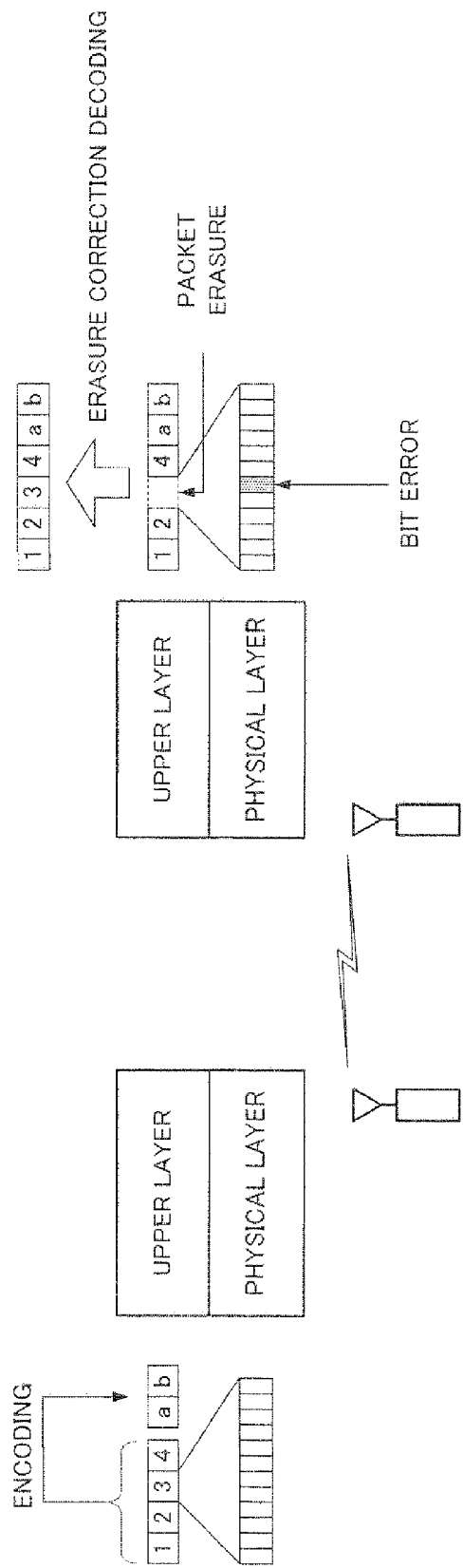
FIG. 1 is a conceptual diagram of a communication system utilizing erasure correction coding using an LDPC code.
Figure 2:
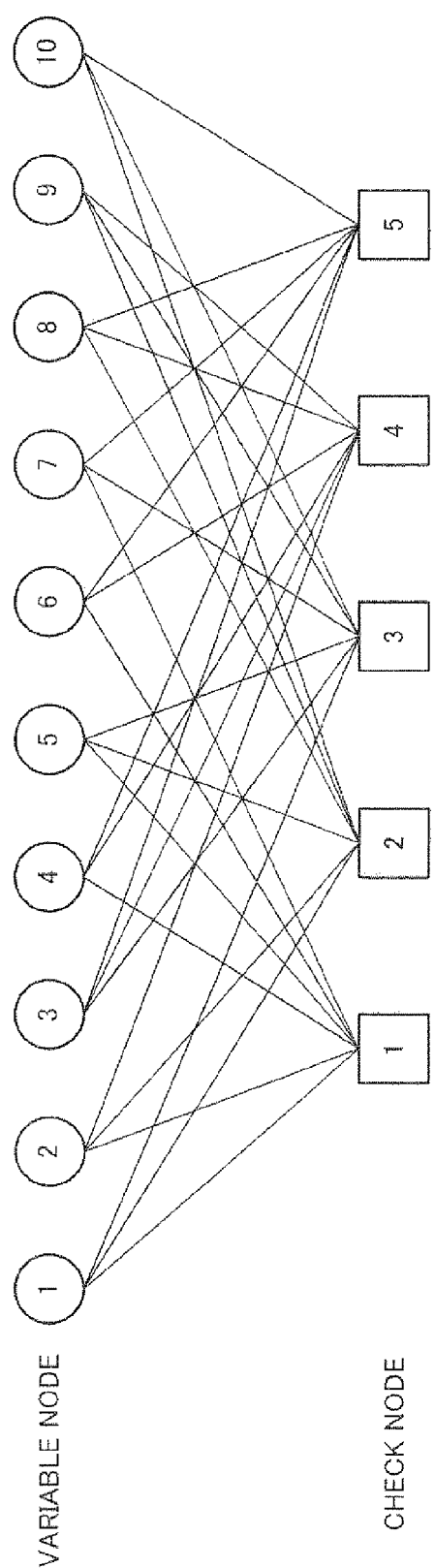
FIG. 2 shows a parity check matrix H using a Tanar graph.
Figure 3:
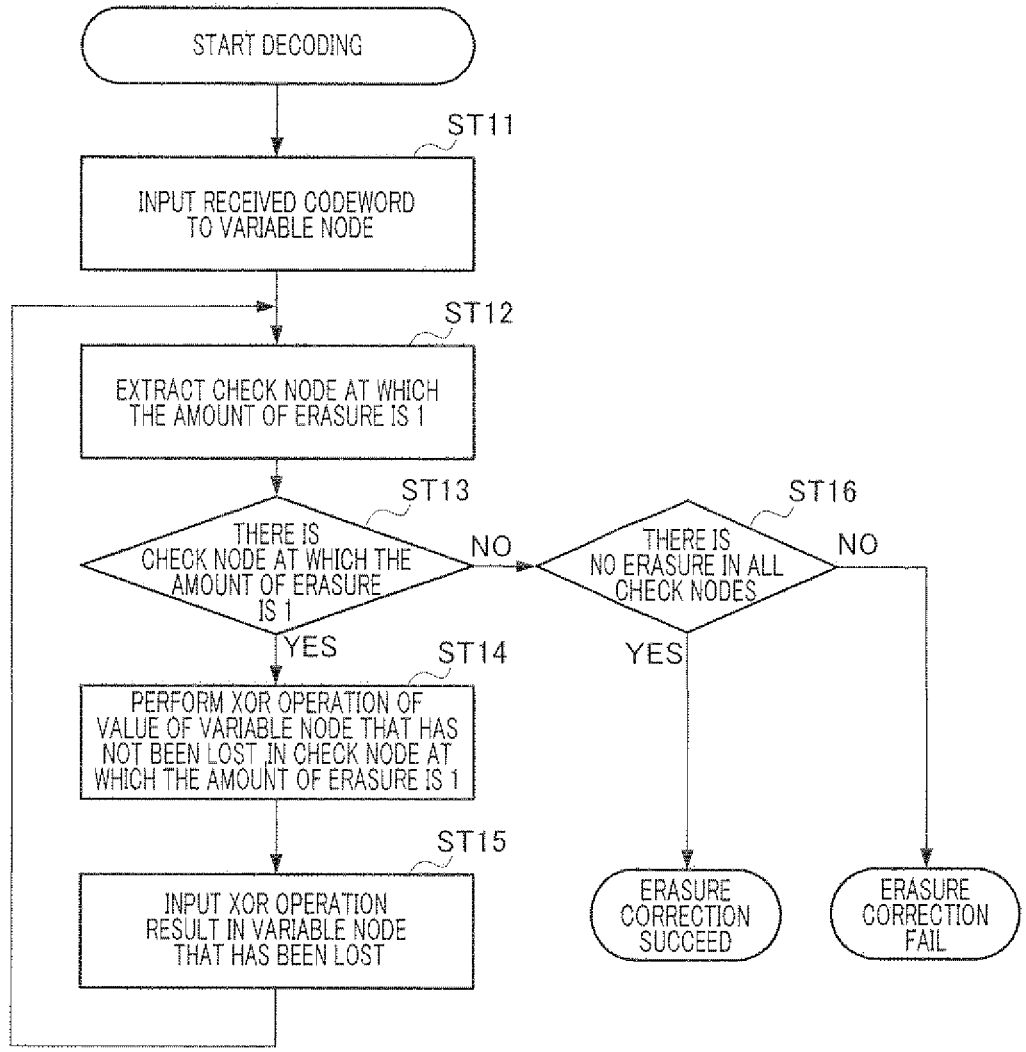
FIG. 3 is a flowchart of an iterative decoding algorithm for LDPC decoding.
Figure 4:
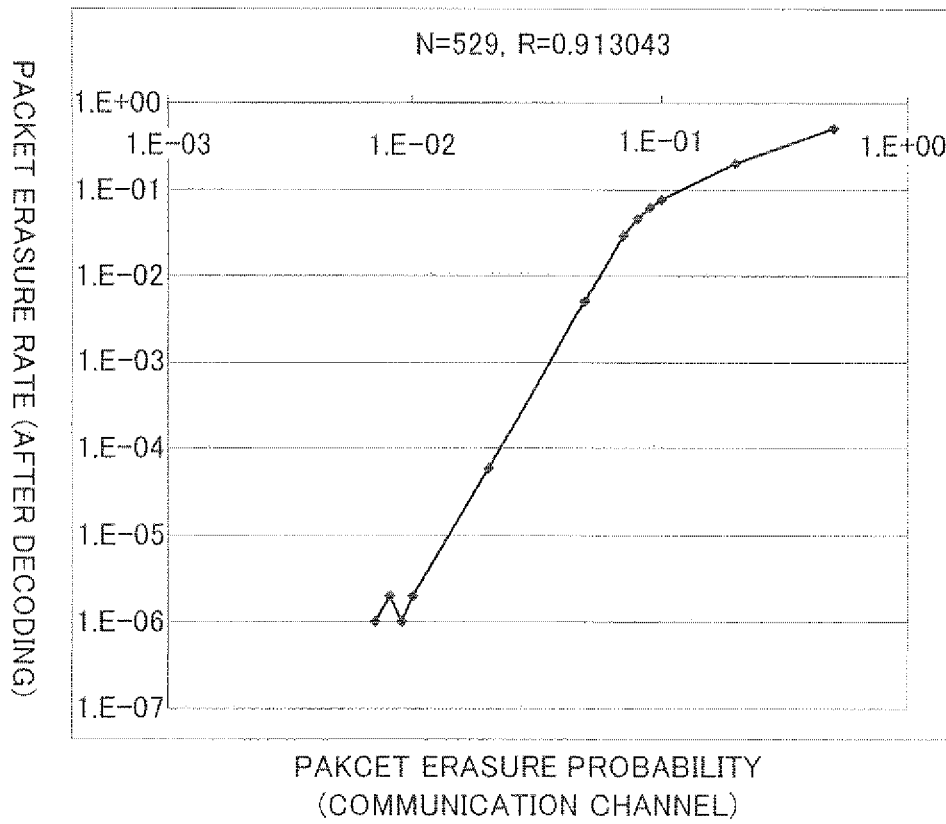
FIG. 4 is a characteristic diagram explaining erasure correction decoding performance in case where erasure correction is performed using an array LDPC code.
Figure 30:
FIG. 30 shows an overall configuration of the communication system according to Embodiment 4 of the present invention.

FIG. 30 shows an overall configuration of the communication system according to Embodiment 4 of the present invention. Note that, in the communication system in FIG. 30 according to the present embodiment, the same components as in FIG. 1 will be assigned the same reference numerals as in FIG. 1 and explanation thereof will be omitted. In FIG. 30, the communication system is formed with packet generating section 110, erasure correction coding apparatus 920, transmitting apparatus 130, communication channel 140, receiving apparatus 150, erasure correction decoding apparatus 960 and packet decoding section 170. In the same figure, packet generating section 110, erasure correction coding apparatus 920 and transmitting apparatus 130 are on the encoding side, and receiving apparatus 150, erasure correction decoding apparatus 960 and packet decoding section 170 are on the decoding side.

Erasure correction coding apparatus 920 performs erasure correction coding processing of the information packet outputted from packet generating section 110. To be more specific, as erasure correction coding processing, erasure correction coding apparatus 920 adds a redundant packet every other information packets the number of which is determined upon encoding. Erasure correction coding apparatus 920 outputs information packets and redundant packets to transmitting apparatus 130. Hereinafter, an information packet and redundant packet will be referred to as a "transmission packet."

When packets are lost among received packets, erasure correction decoding apparatus 960 performs restoring processing of lost packets utilizing redundant packets added by erasure correction coding apparatus 920 on the encoding side. Erasure correction decoding apparatus 960 outputs only the packets corresponding to information packets out of received packets subjected to restoring processing, to packet decoding section 170. By contrast with this, when packets are not lost among received packets, erasure correction decoding apparatus 960 outputs only the packets corresponding to information packets among the received packets without performing decoding processing.

Figure 31:
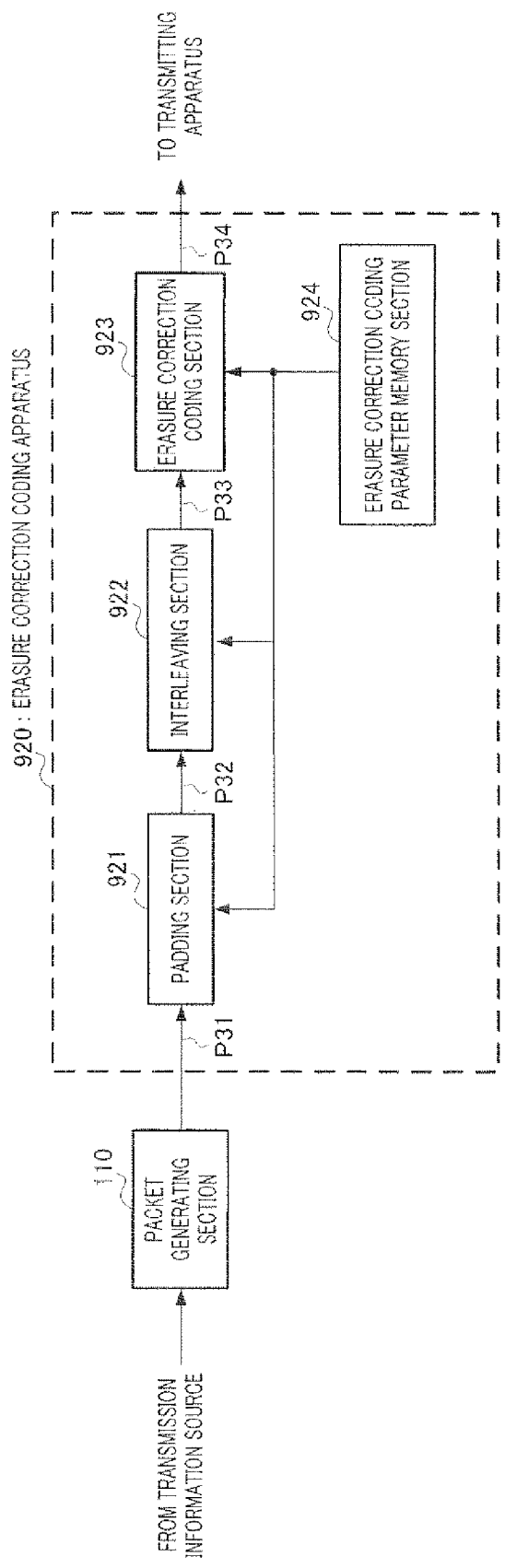
FIG. 31 is a block diagram showing the configuration of main parts of the erasure correction coding apparatus according to Embodiment 4.

FIG. 31 shows the configuration of main parts of erasure correction coding apparatus 920 according to Embodiment 4 of the present invention. Erasure correction coding apparatus 920 uses a low density parity check ("LDPC") code as a erasure correction code. A case will be explained below as an example where erasure correction coding apparatus 920 performs erasure correction coding in units of J information packets. Packet generating section 110 outputs generated information packets to erasure correction coding apparatus 920 in units of J information packets. Further, the number of information packets J is determined based on the total amount of information to transmit and the number of packets to transmit per time.

Erasure correction coding apparatus 920 is formed with padding section 921, interleaving section 922, erasure correction coding section 923 and erasure correction coding parameter memory section 924.

Erasure correction coding parameter memory section 924 stores LDPC code parameters used in erasure correction coding. To be more specific, the parity check matrix H, encoded packet length N, organizing packet length K, redundant packet length M and padding packet length P are stored as LDPC code parameters.

Padding section 921 adds padding packets that are known between both the encoding side and decoding side, to the rear portion of the J information packets outputted from packet generating section 110, and generates an organizing packet sequence formed with K packets. Padding section 921 outputs the organizing packet sequence to interleaving section 922.

Interleaving section 922 performs interleaving processing of reordering packets of the organizing packet sequence. Interleaving section 922 outputs the interleaved organizing packet sequence (hereinafter, "interleaved packet sequence"), to erasure correction coding section 923. Further, interleaving processing will be described later.

Erasure correction coding section 923 performs LDPC coding processing of the interleaved packet sequence based on the parity check matrix H held in erasure correction coding parameter memory section 924, and generates a redundant packet sequence. Further, erasure correction coding section 923 adds the generated redundant packet sequence to the interleaved packet sequence, and outputs the encoded packet sequence to which the redundant packet has been added, to transmitting apparatus 130. Further, a erasure correction coding method will be described later.

Figure 32:
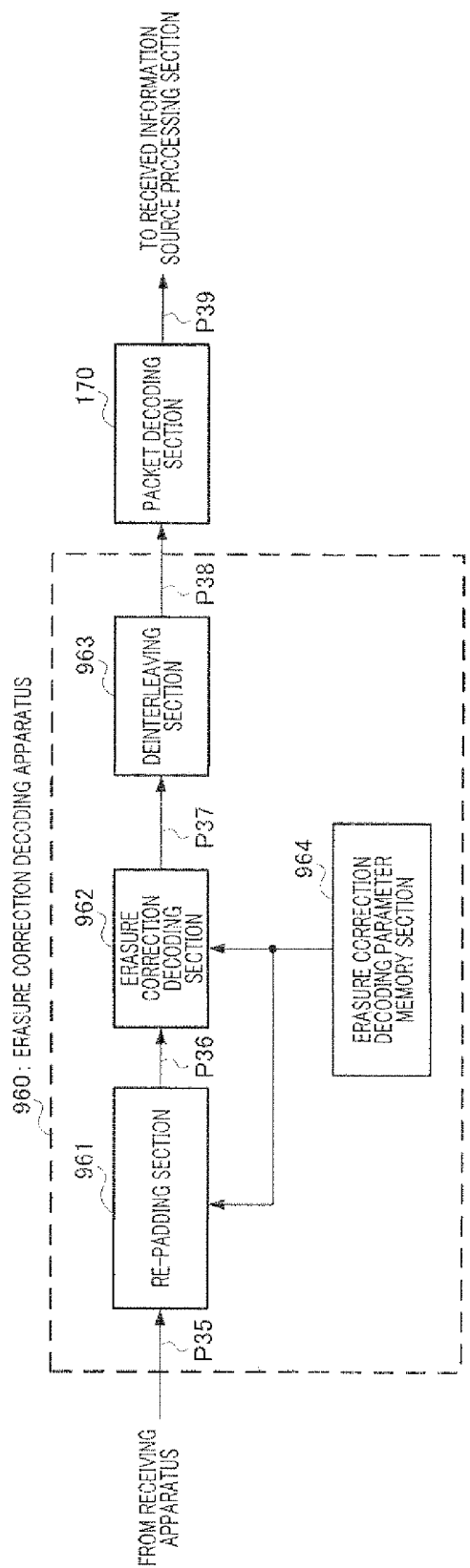
FIG. 32 is a block diagram showing the configuration of main parts of the erasure correction decoding apparatus according to Embodiment 4.

FIG. 32 shows the configuration of main parts of erasure correction decoding apparatus 960 according to Embodiment 4 of the present invention. Erasure correction decoding apparatus 960 is formed with re-padding section 961, erasure correction decoding section 962, deinterleaving section 963 and erasure correction decoding parameter memory section 964.

Erasure correction decoding parameter memory section 964 stores LDPC code parameters used in erasure correction coding/decoding.

When there is erasure in the received packet sequence and when the padding packet is lost, re-padding section 961 inserts a padding packet again in a position in which the packet erasure has occurred. Re-padding section 961 outputs the re-padded packet sequence to erasure correction decoding section 962.

Erasure correction decoding section 962 performs erasure correction decoding processing of the re-padded packet sequence based on the parity check matrix H, extracts only packets corresponding to the organizing packet sequence from the decoding result and outputs the extracted organizing packet sequence subjected to erasure correction decoding, to deinterleaving section 963.

Deinterleaving section 963 performs reverse reordering processing (i.e. deinterleaving processing) of the interleaving processing performed on the encoding side, with respect to the organizing packet sequence subjected to erasure correction decoding. Deinterleaving section 963 outputs only the packets corresponding to the information packet sequence of the organizing packet sequence that is subjected to deinterleaving processing, to packet decoding section 170.

The operations of erasure correction coding apparatus 920 and erasure correction decoding apparatus 960 will be explained. Further, a case will be explained below as an example where three information packets (J=3) are outputted from packet generating section 110. Furthermore, a case will be explained as an example where erasure correction coding/decoding is performed using the above-described matrix represented by equation 1 as the parity check matrix H that defines an LDPC code used as a erasure correction code. The parity check matrix H of equation 1 is an example of a case where the encoded packet length is N=10, the organizing packet length is K=5 and the redundant packet length is M=5.

(Operation of the Erasure Correction Coding Apparatus)

FIG. 33 shows packet sequences inputted in and outputted from each section of erasure correction coding apparatus 920. Further, the same reference numerals as the corresponding packet sequences of FIG. 31 will be assigned in FIG. 33.

FIG. 33A shows the information packet sequence P31 outputted from packet generating section 110. The information packet sequence P31 is formed with three information packets.

Padding section 921 adds a padding packet sequence formed with two (=P=K−J) padding packets, to the rear portion of the information packet sequence P11 outputted from packet generating section 110, and generates the organizing packet sequence P32 formed with five packets (see FIG. 33B).

Interleaving section 922 performs interleaving processing of the organizing packet sequence P32. Practically, interleaving section 922 performs interleaving by means of the following processings.

(Interleaving Processing)

(1) All minimum stopping sets included in the parity check matrix H are extracted.

(2) How many minimum stopping sets in all combinations of minimum stopping sets include each variable node corresponding to the redundant packet, is checked.

(3) Each variable node corresponding to the redundant packet is reordered in order from a variable node included in a greater number of minimum stopping sets. Hereinafter, the reordering result will be referred to as the "variable node list."

(4) The packet of the variable node corresponding to the first place in the variable node list is replaced with the packet at the tail of the organizing packet sequence P32, that is, a padding packet.

(5) Next, the packet of the variable node corresponding to the second place in the variable node list is replaced with the second packet from the tail of the organizing packet sequence, that is, a padding packet.

(6) Therefore, a redundant packet corresponding to a variable node in a higher place in the variable node list is sequentially replaced with a padding packet to perform interleaving processing.

Note that processings (1) to (3) of the above interleaving processing needs not to be performed every interleaving processing and every coding processing, and, for example, interleaving section 922 may perform only processings (4) to (6) by performing processings (1) to (3) in advance and storing the result in erasure correction coding parameter memory section 924.

In this way, to perform interleaving processing, interleaving section 922 performs processing of replacing a packet positioned in the rear portion of the organizing packet sequence P32, with a redundant packet in a position corresponding to one of variable nodes forming a minimum stopping set in the parity check matrix H that is used in LDPC coding. That is, by replacing the packet positioned in the rear portion of the organizing packet sequence P32, with the redundant packet in a position corresponding to one of variable nodes forming a minimum stopping set in the parity check matrix H that is used in LDPC coding, interleaving section 922 assigns padding packets to the positions corresponding to variable nodes forming a minimum stopping set.

When above steps (1) to (6) are performed, a padding packet is preferentially assigned to the position corresponding to a variable node in order from a variable node included in a greater number of minimum stopping sets. Interleaving processing will be explained using again the parity check matrix H determined by equation 1.

The minimum stopping set size of the parity check matrix H determined by equation 1 is three, and there are seven combinations of variable nodes, as presented in advance by equation 2-1 to equation 2-7.

The variable node 8 and variable node 9 are two of the variable nodes 6 to 10 corresponding to the redundant packet sequence, and are included in the greatest number of minimum stopping sets out of the above seven minimum stopping sets (that is, the variable node 8 and variable node 9 are included in three patterns out of the seven patterns).

Interleaving section 922 replaces (i.e. interleaves) the packet (i.e. padding packet 2) at the tail of the organizing packet sequence P32, with the position of the variable node 8.

Further, interleaving section 922 replaces (i.e. interleaves) the position of the second packet (i.e. padding packet 1) from the tail of the organizing packet sequence P32, with the position of the variable node 9.

In this way, interleaving section 922 performs processing of assigning the padding packet at the rear portion of the organizing packet sequence P32, to the position corresponding to the variable node which is one of variable nodes corresponding to the redundant packet sequence and which forms a minimum stopping set in the parity check matrix H. As a result, the interleaved packet sequence P33 shown in FIG. 33C is acquired.

By so doing, the padding packets 2 and 1 are arranged in the positions of the variable node 8 and variable node 9 which are ones of the variable nodes 6 to 10 corresponding to the redundant packet sequence and which are included in the greatest number of minimum stopping sets. The padding packets 2 and 1 are known packets, so that, even when the padding packets 2 and 1 in positions corresponding to the variable nodes 8 and 9 are lost on communication channel 140, re-padding section 961 of erasure correction decoding apparatus 960 on the decoding side can re-pad the padding packets 2 and 1 that are lost. Consequently, even when packets in positions corresponding to other variable nodes in minimum stopping sets including the variable nodes 8 and 9 are lost, there is a possibility that erasure correction decoding section 962 can perform erasure correction decoding.

By contrast with this, when the redundant packets 3 and 4 in positions corresponding to the variable nodes 8 and 9 are lost because interleaving processing is not performed, the redundant packets 3 and 4 are not known and, therefore, it is difficult for re-padding section 961 to perform re-padding. Further, when packets in positions corresponding to other variable nodes in the minimum stopping sets including the variable nodes 8 and 9 are lost, there is a higher possibility that erasure correction decoding section 962 fails to perform erasure correction decoding processing.

Erasure correction coding section 923 generates the information packets 4 and 5 and redundant packets 1, 2 and 5, based on the parity check matrix H held in erasure correction coding parameter memory section 924, and adds the redundant packets 1, 2 and 5 to the interleaved packet sequence P33 to generate the encoded packet sequence P34 formed with the N packets shown in FIG. 33D.

Further, as an example of encoding processing, erasure correction coding section 923 performs encoding processing based on the parity check matrix $H_{perm}$ obtained by rearranging the columns in the parity check matrix H. The parity check matrix $H_{perm}$ subjected to the rearrangement is obtained by rearranging the columns in the parity check matrix H held in erasure correction coding parameter memory section 924 in the order of 1, 2, 3, 8, 9, 4, 5, 6, 7 and 10. Accordingly, erasure correction coding section 923 generates the information packets 4 and 5 and redundant packets 1, 2 and 5 by performing encoding processing based on the parity check matrix $H_{perm}$ subjected to rearrangement. Further, erasure correction coding section 923 acquires the encoded packet sequence P34 by arranging the resulting information packets 4 and 5 and redundant packets 1, 2 and 5 as shown in FIG. 33D, and outputs the encoded packet sequence P34 to transmitting apparatus 130.

In this way, interleaving section 922 assigns a padding packet preferentially to a position corresponding to the variable node which is one of variable nodes corresponding to a redundant packet sequence and which is included in the greatest number of minimum stopping sets in the parity check matrix H. By so doing, even when a packet in a position corresponding to a variable node that influences erasure correction the most significantly is lost, re-padding section 961 of erasure correction decoding apparatus 960 on the decoding side re-pads known padding packets, so that it is possible to increase the possibility of erasure correction decoding.

(Operation of the Erasure Correction Decoding Apparatus)

Next, the operation of erasure correction decoding apparatus 960 will be explained. FIG. 34 shows packet sequences inputted in and outputted from each section of erasure correction decoding apparatus 960. Further, the same reference numerals as the corresponding packet sequences in FIG. 32 will be assigned in FIG. 34.

FIG. 34A shows the received packet sequence P35 outputted from receiving apparatus 150. In FIG. 34A, three packets to which "x" symbols are assigned represent packets that are lost on communication channel 140. FIG. 34A shows an example of a case where the second, fourth and eighth packets are lost. Variable nodes corresponding to three lost packets are the variable nodes 2, 4 and 8, and the combination of these variable nodes (2, 4, and 8) matches the minimum stopping set SS2 shown in equation 2-2. Further, one of the lost packets (i.e. the eighth packet) is the padding packet 1 that is padded on the encoding side.

Re-padding section 961 determines the position to which a padding packet is inserted on the encoding side, based on the number of padding packets P(=2) held in erasure correction decoding parameter memory section 964 and a pattern of deinterleaving performed in deinterleaving section 963. Further, re-padding section 961 decides whether or not padding packets are included in the lost packets and, when padding packets are included in the lost packets, re-padding section 961 inserts padding packets again to the positions of the lost packets.

Further, in case where padding packets are not included in the lost packets, re-padding section 961 outputs the received packet sequence P35 to erasure correction decoding section 962 without performing re-padding. Here, the packet in the eighth position from the head of the packet sequence is the padding packet 1 and, consequently, re-padding section 961 inserts the padding packet 1 to the eighth packet position. As a result, the packet sequence P36 shown in FIG. 34B is acquired.

When there is erasure in the organizing packet sequence in the packet sequence P36, erasure correction decoding section 962 performs erasure correction decoding processing based on the parity check matrix H held in erasure correction decoding parameter memory section 964. The above-described iterative decoding algorithm may be used for erasure correction decoding processing. After decoding processing is finished, erasure correction decoding section 962 outputs the decoded packet sequence P37 to deinterleaving section 963 as shown in FIG. 34C.

By contrast with this, when there is not erasure in the packet sequence P36 or when there is erasure only in a redundant packet sequence, erasure correction decoding section 962 outputs the organizing packet sequence P37 to deinterleaving section 963 without performing erasure correction decoding processing.

Deinterleaving section 963 performs reverse processing of the interleaving processing performed in interleaving section 922 on the encoding side, with respect to the organizing packet sequence P37, and reorders packets. FIG. 34D shows the deinterleaved organizing packet sequence P38. The order of packets in the organizing packet sequence P38 in FIG. 34D matches the order of packets in the organizing packet sequence P32 before interleaving on the encoding side (see FIG. 33B).

Deinterleaving section 963 outputs the information packet sequence P39 formed only with information packets of the deinterleaved organizing packet sequence P38 shown in FIG. 34E, to packet decoding section 170.

As described above, interleaving section 922 on the encoding side assigns padding packets to positions corresponding to variable nodes which are ones of variable nodes corresponding to a redundant packet sequence and which form a minimum stopping set. With the example of FIG. 33, interleaving section 922 assigns a padding packet to the variable node 8.

Consequently, even when packets (i.e. the second, fourth and eight packets) corresponding to variable nodes in the minimum stopping set SS2 are lost on communication channel 140, the eighth packet can be restored by means of re-padding, so that packet decoding section 170 makes it possible to avoid failure of erasure correction due to SS2. Further, with the example of FIG. 33, it is also possible to avoid failure of erasure correction due to other stopping sets (SS4 and SS7) than SS2 including the variable node 8 by assigning a known padding packet to the variable node 8.

In this way, interleaving section 922 on the encoding side replaces the padding packet positioned in the rear portion of the organizing packet sequence P32 with the position corresponding to a variable node which is one of variable nodes corresponding to a redundant packet sequence and which forms a minimum stopping set in the parity check matrix H that is used in LDPC coding.

Consequently, even when there is erasure in positions in minimum stopping sets on communication channel 140, re-padding section 961 can perform re-padding, so that it is possible to avoid failure of erasure correction due to the minimum stopping set.

As described above, according to the present embodiment, erasure correction coding apparatus 920 has: padding section 921 that adds padding packets to an information packet sequence; interleaving section 922 that reorders a packet sequence to which the padding packets are added; and erasure correction coding section 923 that performs erasure correction coding of the interleaved packet sequence. Moreover, interleaving section 922 reorders the packet sequence to which padding are added, based on variable nodes forming a minimum stopping set in the parity check matrix that defines the low density parity check code.

Further, erasure correction decoding apparatus 960 has: re-padding section 961 that performs re-padding of the received packet sequence; erasure correction decoding section 962 that performs erasure correction decoding of the re-padded packet sequence; and deinterleaving section 963 that reorders the packet sequence subjected to erasure correction decoding.

Furthermore, it is possible to reduce the probability of failure of erasure correction due to minimum stopping sets by changing the reordering pattern in interleaving section 922, to such a reordering pattern to avoid failure of erasure correction due to minimum stopping sets, based on variable nodes forming a minimum stopping set that relates to limitation of the characteristics of correction performance of the LDPC parity check matrix.

In this way, by using the present invention, it is possible to provide an advantage of reducing the probability of failure of correction due to the minimum stopping set, which is the foremost factor that deteriorates the correction performance of a erasure correction code, by utilizing adequate interleaving/deinterleaving and padding packets that are conventionally inserted to adjust the number of packets involved in erasure correction coding/decoding. That is, it is possible to reduce the probability that packets lost on a communication channel match minimum stopping sets included in the parity check matrix and, consequently, improve erasure correction performance.

Interleaving section 922 employs a configuration of performing interleaving by assigning known packets to positions corresponding to variable nodes which are ones of variable nodes corresponding to a redundant packet sequence and which form minimum stopping sets.

By this means, when there is erasure in positions in the minimum stopping sets, re-padding section 961 on the decoding side re-pads lost packets, so that it is possible to avoid failure of erasure correction due to the minimum stopping sets.

Further, although a case has been explained so far where the position to add a padding packet in padding section 921 is the rear portion of an information packet sequence, the present invention is not limited to this, and the position to add the padding packet may be the head or the middle of an information packet sequence as long as this position is known between the encoding side and the decoding side.

For example, when padding section 921 adds a padding packet to the head of an information packet sequence, interleaving section 922 may perform interleaving processing using an interleaving pattern of replacing a packet corresponding to the top in the variable node list, with the packet at the front head of an organizing packet sequence. When padding section 921 adds a padding packet to the middle of an information packet sequence, interleaving section 922 sequentially replaces packets in the middle of the information sequence in the same way, with packets of variable nodes described in the variable node list.

Further, although a case has been explained with the present embodiment where the parity check matrix H shown in equation 1 is used, the parity check matrix H is not limited to the parity check matrix shown in equation 1, and, even when other parity check matrices are used, it is possible to provide the same advantage by using the present invention.

Further, although a case has been explained with the present embodiment where a variable node list is created using only variable nodes corresponding to a redundant packet sequence, a variable node list may be created using all variable nodes, that is, a variable node list may include variable nodes corresponding to an organizing packet sequence may be created. Furthermore, the present embodiment may be combined with Embodiment 1.

To be more specific, in case where padding packets are assigned to variable nodes corresponding to an organizing packet sequence, the method explained in Embodiment 1 may be used. Further, in case where padding packets are assigned to variable nodes corresponding to a redundant packet sequence, the method explained in the present embodiment may be used.

According to the above configuration, it is possible to provide the advantage of the present invention of avoiding failure of erasure correction due to minimum stopping sets.

Embodiment 5

The cases have been explained with the above embodiments where a regular LDPC code is used as an LDPC code used in erasure correction coding. A regular LDPC code refers to an LDPC code in which all columns and all rows have the same column degree and row degree in the parity check matrix H. The present invention is not limited to a regular LDPC code and is also applicable in ease where an irregular LDPC code is used. An irregular LDPC code refers to an LDPC code in which column degrees and row degrees have a plurality of values in the parity check matrix H.

A case will be explained with the present embodiment where the present invention is applied to a erasure correction coding apparatus that uses irregular LDPC codes. With an irregular LDPC code, the column degree varies between columns and there are columns having great column degrees and columns having small column degrees. Columns having great column degrees relate to a plurality of parity check equations (i.e. rows), and columns having greater column degrees relate to a greater number of parity check equations (i.e. rows).

Therefore, when packets assigned to columns having great column degrees are lost, erasure correction decoding performance deteriorates. Hence, with the present embodiment, when an irregular LDPC code is used, a erasure correction coding apparatus will be explained that has an interleaving section (i.e. interleaver) which assigns padding packets to variable nodes having great column degrees.

A case will be explained below as an example where the parity check matrix shown in equation 5 is used. The parity check matrix H shown in equation 5 defines an irregular LDPC code of an organizing packet length K=4, redundant packet length M=4 and coding rate 1/2.

[5]

$$H = \begin{pmatrix} 1 & 1 & 1 & 0 & 1 & 0 & 0 & 0 \\ 0 & 1 & 1 & 1 & 0 & 1 & 0 & 0 \\ 1 & 1 & 0 & 1 & 0 & 0 & 1 & 0 \\ 0 & 0 & 1 & 0 & 1 & 1 & 0 & 1 \end{pmatrix} \quad \text{(Equation 5)}$$

The column degrees of columns in the parity check matrix H shown in equation 5 are 2, 3, 3, 2, 2, 2, 1 and 1 and are not constant, and column degrees of the second and third nodes are becomes maximum at three.

Figure 35:
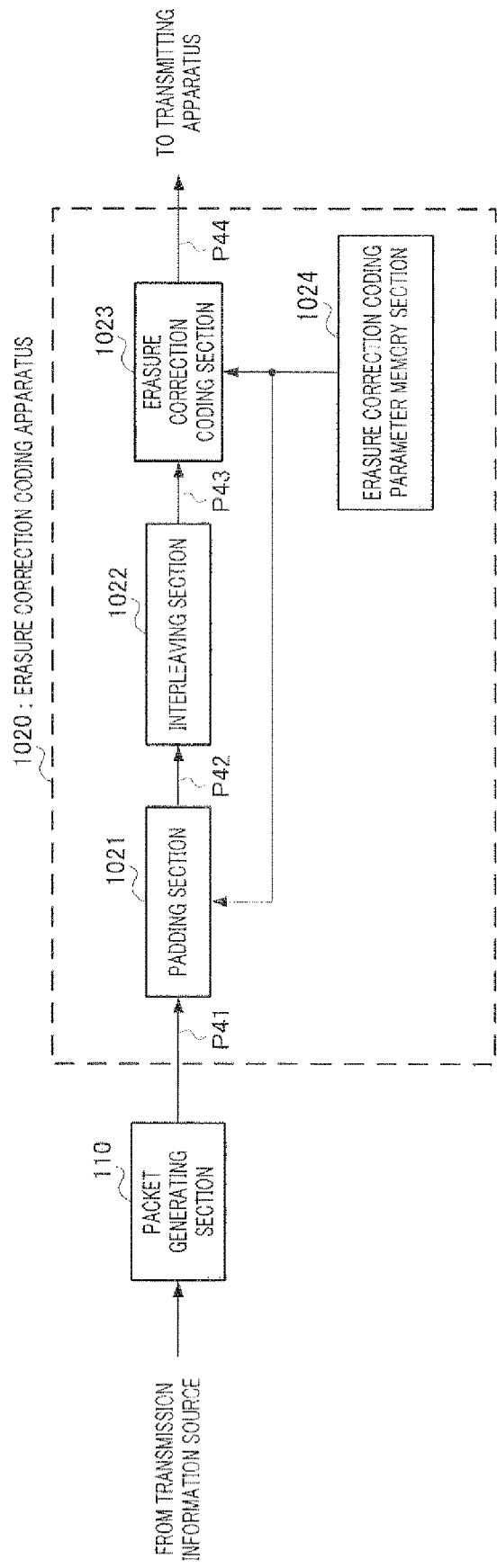
FIG. 35 is a block diagram showing the configuration of main parts of the erasure correction coding apparatus according to Embodiment 5 of the present invention.

FIG. 35 shows the configuration of erasure correction coding apparatus 1020 according to the present embodiment. Erasure correction coding apparatus 1020 uses an irregular LDPC code as a erasure correction code. A case will be explained below as an example where erasure correction coding apparatus 1020 performs erasure correction coding in units of J information packets. Packet generating section 110 outputs generated information packets to erasure correction coding apparatus 1020 in units of J information packets. Further, the number of information packets J is determined based on the total amount of information to transmit and the number of packets to transmit per time.

Erasure correction coding apparatus 1020 is formed with padding section 1021, interleaving section 1022, erasure correction coding section 1023 and erasure correction coding parameter memory section 1024.

Erasure correction coding parameter memory section 1024 stores irregular LDPC code parameters used in erasure correction coding. To be more specific, the parity check matrix H, encoded packet length N, organizing packet length K, redundant packet length M and padding packet length P are stored as irregular LDPC code parameters.

Padding section 1021 adds a padding packet that is known between both the encoding side and decoding side, to the rear portion of the J information packets outputted from packet generating section 110, and generates an organizing packet sequence formed with K packets. Padding section 1021 outputs the organizing packet sequence to interleaving section 1022.

Interleaving section 1022 performs interleaving processing of reordering packets of the organizing packet sequence. Interleaving section 1022 outputs the interleaved organizing packet sequence (hereinafter, "interleaved packet sequence"), to erasure correction coding section 1023. Further, interleaving processing will be described later.

Erasure correction coding section 1023 performs LDPC coding processing of the interleaved packet sequence based on the parity check matrix H held in erasure correction coding parameter memory section 1024, and generates a redundant packet sequence. Further, erasure correction coding section 1023 adds the generated redundant packet sequence to the rear portion of the interleaved packet sequence, and outputs the encoded packet sequence to which the redundant packet has been added, to transmitting apparatus 130.

Figure 36:
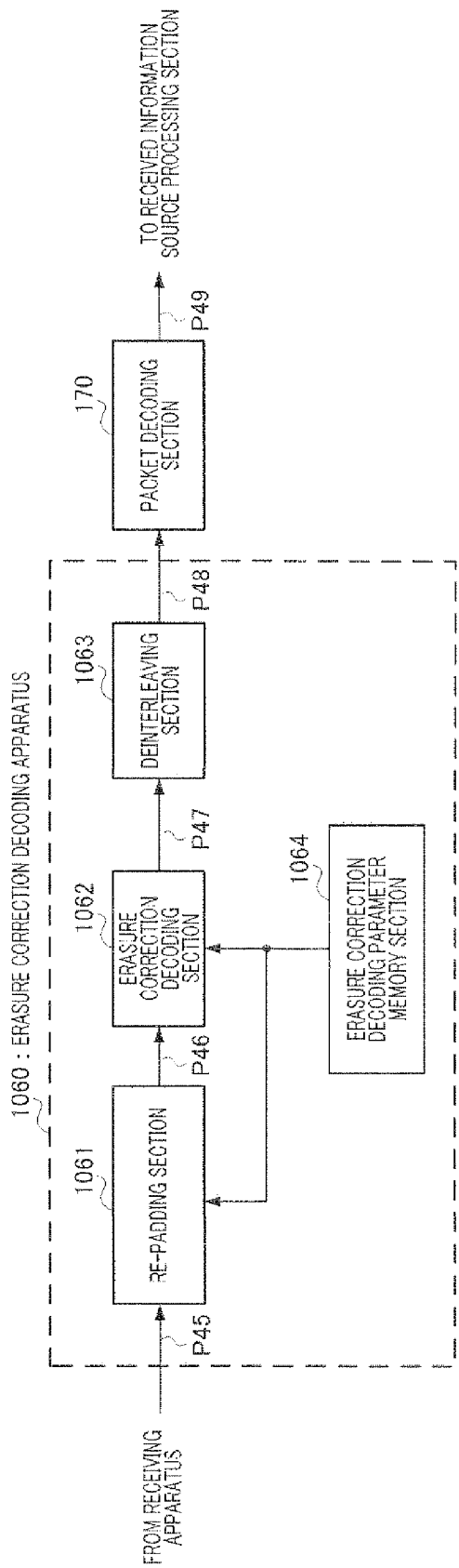
FIG. 36 is a block diagram showing the configuration of main parts of the erasure correction decoding apparatus according to Embodiment 5.

FIG. 36 shows the configuration of main parts of erasure correction decoding apparatus 1060 according to Embodiment 5 of the present invention. Erasure correction decoding apparatus 1060 is formed with re-padding section 1061, erasure correction decoding section 1062, deinterleaving section 1063 and erasure correction decoding parameter memory section 1064.

Erasure correction decoding parameter memory section 1064 stores irregular LDPC code parameters used in erasure correction coding/decoding.

When there is erasure in the received packet sequence and when the padding packet is lost, re-padding section 1061 inserts a padding packet again in a position in which the packet erasure has occurred. Re-padding section 1061 outputs the re-padded packet sequence to erasure correction decoding section 1062.

Erasure correction decoding section 1062 performs erasure correction decoding processing of the re-padded packet sequence based on the parity check matrix H, extracts only packets corresponding to the organizing packet sequence, from the decoding result and outputs the extracted organizing packet sequence subjected to erasure correction, to deinterleaving section 1063.

Deinterleaving section 1063 performs reverse reordering processing (i.e. deinterleaving processing) of the interleaving processing performed on the encoding side, with respect to the organizing packet sequence subjected to erasure correction. Deinterleaving section 1063 outputs only the packets corresponding to the information packet sequence of the organizing packet sequence that is subjected to deinterleaving processing, to packet decoding section 170.

The operations of erasure correction coding apparatus 1020 and erasure correction decoding apparatus 1060 will be explained below. Further, a case will be explained below as an example where three information packets (J=3) are outputted from packet generating section 110. Furthermore, a case will be explained as an example where erasure correction coding/decoding is performed using the above-described matrix represented by equation 5 as the parity check matrix H that defines an LDPC code used as a erasure correction code. The parity check matrix H of equation 5 is an example of a case where the encoded packet length is N=8, the organizing packet length is K=4 and the redundant packet length is M=4.

(Operation of the Erasure Correction Coding Apparatus)

FIG. 37 shows packet sequences inputted in and outputted from each section of erasure correction coding apparatus 1020. Further, the same reference numerals as the corresponding packet sequences of FIG. 35 will be assigned in FIG. 37.

FIG. 37A shows the information packet sequence P41 outputted from packet generating section 110. The information packet sequence P41 is formed with three information packets.

Padding section 1021 adds a padding packet sequence formed with one (=P=K−J) padding packet, to the rear portion of the information packet sequence P41 outputted from packet generating section 110, and generates the organizing packet sequence P42 formed with four packets (see FIG. 37B).

Interleaving section 1022 performs interleaving processing of the organizing packet sequence P42. Practically, interleaving section 1022 performs interleaving by means of the following processings.

(Interleaving Processing)

(1) Each variable node corresponding to the organizing packet sequence is reordered in order from a greater column degree in the parity check matrix H. Hereinafter, the reordering result will be referred to as a "variable node list."

(2) Next, the packet of the variable node corresponding to the first place in the variable node list is replaced with the packet at the tail of the organizing packet sequence P42, that is, a padding packet.

By performing interleaving processing of above-described (1) and (2), a padding packet is assigned to the position corresponding to the variable node of the maximum column degree.

In this way, to perform interleaving processing, interleaving section 1022 performs processing of replacing a padding packet positioned in the rear portion of the organizing packet sequence P42, with a packet in a position corresponding to one of variable nodes of the maximum column degree in the parity check matrix H that is used in LDPC coding.

By replacing the padding packet positioned in the rear portion of the organizing packet sequence P42 with the packet in a position corresponding to one of variable nodes of the maximum column degree in the parity check matrix H that is used in LDPC coding, interleaving section 1022 assigns a padding packet to the position corresponding to the variable node of the maximum column degree. As a result, the interleaved packet sequence P43 shown in FIG. 37C is acquired.

By so doing, the padding packet 1 is arranged in the position of the variable node 3 of the maximum column degree. The padding packet 1 is a known packet, so that, even when the padding packet 1 in a position corresponding to the variable node 3 is lost on communication channel 140, re-padding section 1061 of erasure correction decoding apparatus 1060 on the decoding side can re-pad the padding packet 1 that is lost. Consequently, it is possible to avoid deterioration in error correction decoding performance due to erasure of the variable node 3 of a maximum column degree.

Erasure correction coding section 1023 generates the redundant packets 1 to 4 based on the parity check matrix H held in erasure correction coding parameter memory section 1024 and adds the redundant packets 1 to 4 to the interleaved packet sequence P43 to generate the encoded packet sequence P44 formed with the N packets shown in FIG. 37D.

In this way, interleaving section 1022 assigns a padding packet to a position corresponding to the variable node of a maximum column degree in the parity check matrix H. By so doing, even when a packet in a position corresponding to a variable node of a maximum column degree influencing erasure correction decoding performance, re-padding section 1061 of erasure correction decoding apparatus 1060 on the decoding side can perform re-padding, so that it is possible to increase the possibility of erasure correction decoding.

(Operation of the Erasure Correction Decoding Apparatus)

Next, the operation of erasure correction decoding apparatus 1060 will be explained. FIG. 38 shows packet sequences inputted in and outputted from each section of erasure correction decoding apparatus 1060. Further, the same reference numerals as the corresponding packet sequences in FIG. 36 will be assigned in FIG. 38.

FIG. 38A shows the received packet sequence P45 outputted from receiving apparatus 150. In FIG. 38A, three packets to which "x" symbols are assigned represent packets that are lost on communication channel 140. FIG. 38A shows an example of a case where the third and fourth packets are lost. The variable node corresponding to the third packet between two lost packets has the maximum column degree.

Re-padding section 1061 determines the position to which a padding packet is inserted on the encoding side, based on the number of padding packets P(=1) held in erasure correction decoding parameter memory section 1064 and a pattern of deinterleaving performed in deinterleaving section 1063. Further, re-padding section 1061 decides whether or not padding packets are included in lost packets. When padding packets are included in the lost packets, re-padding section 1061 inserts padding packets again to the positions of the lost packets.

Further, when padding packets are not included in the lost packets, re-padding section 1061 outputs the received packet sequence P45 to erasure correction decoding section 1062 without performing re-padding. Here, the packet in the third position from the head of the packet sequence is the padding packet 1 and, consequently, re-padding section 1061 inserts the padding packet 1 to the third packet position. As a result, the packet sequence P46 shown in FIG. 38B is acquired.

When there is erasure in the organizing packet sequence of the packet sequence P46, erasure correction decoding section 1062 performs erasure correction decoding processing based on the parity check matrix H held in erasure correction decoding parameter memory section 1064.

The above-described iterative decoding algorithm may be used for erasure correction decoding processing. After decoding processing is finished, erasure correction decoding section 1062 outputs only the organizing packet sequence P47 to deinterleaving section 1063 as shown in FIG. 38C.

By contrast with this, when there is not erasure in the packet sequence P46 or when there is erasure only in a redundant packet sequence, erasure correction decoding section 1062 outputs only the organizing packet sequence P47 to deinterleaving section 1063 without performing erasure correction decoding processing.

Deinterleaving section 1063 performs reverse processing of the interleaving processing performed in interleaving section 1022 on the encoding side, with respect to the organizing packet sequence P17, and reorders packets.

Deinterleaving section 1063 outputs the information packet sequence P49, formed only with information packets shown in FIG. 38E of the deinterleaved organizing packet sequence P48 shown in FIG. 38E, to packet decoding section 170.

As described above, interleaving section 1022 on the encoding side assigns a padding packet to the position corresponding to the variable node of the maximum column degree. With the example of FIG. 37, interleaving section 1022 assigns a padding packet to the variable node 3. Consequently, even when the packet (i.e. the third packet) corresponding to the variable node of the maximum column degree is lost on communication channel 140, the third packet can be restored by means of re-padding, Consequently, packet decoding section 170 makes it possible to avoid deterioration in erasure correction decoding performance.

In this way, interleaving section 1022 on the encoding side is configured to replace the padding packet included in the organizing packet sequence P42 with the packet in a position corresponding to one of variable nodes of a maximum column degree in the parity check matrix H that is used in LDPC coding.

Consequently, even when there is erasure in the position of the maximum column degree on communication channel 140, re-padding section 1061 can perform re-padding, so that it is possible to avoid failure of packet erasure correction.

As described above, according to the present embodiment, erasure correction coding apparatus 1020 employs a configuration including: padding section 1021 that adds padding packets to an information packet sequence; interleaving section 1022 that reorders the packet sequence to which the padding packets have been added; and erasure coding section 1023 that performs erasure correction coding of the interleaved packet sequence. Further, interleaving section 1022 reorders the packet sequence to which padding packets are added, based on column degrees in the parity check matrix that defines the low density parity check code.

Further, erasure correction decoding apparatus 1060 has: re-padding section 1061 that performs re-padding of the received packet sequence; erasure correction decoding section 1062 that performs erasure correction decoding of the re-padded packet sequence; and deinterleaving section 1063 that reorders the packet sequence subjected to erasure correction decoding.

Consequently, it is possible to reduce deterioration in erasure correction decoding performance by changing the pattern of reordering information packets and known packets, to such a reordering pattern to avoid failure of erasure correction due to erasure of a packet assigned to a variable node of a maximum column degree, based on the variable node of the maximum column degree that relates to limitation of the characteristics of correction performance of the LDPC parity check matrix.

In this way, by using the present invention, it is possible to provide an advantage of reducing the probability of failure of correction due to erasure of the variable node of the maximum column degree, which is the foremost factor that deteriorates the correction performance of a erasure correction code, by utilizing adequate interleaving/deinterleaving and padding packets that are conventionally inserted to adjust the number of packets involved in erasure correction coding/decoding.

Further, although a case has been explained with the present embodiment where the parity check matrix H of an irregular LDPC code shown in equation 5 is used, the parity check matrix H is not limited to the parity check matrix shown in equation 5 and, even when other parity check matrices of an irregular LDPC code are used, it is possible to provide the same advantage by using the present invention.

Further, although a system that performs erasure correction coding/decoding in units of IP packets has been explained as an example, the present invention is not limited to this, and erasure correction coding/decoding may be performed in units of TSs of MPEG, in block units obtained by dividing an IP packet into a plurality of blocks or in block units of an arbitrary number of bits.

The present invention is not limited to all of the above embodiments, and can be variously modified and implemented. For example, although cases have been explained with the above embodiments where the present invention is implemented mainly using a erasure correction coding apparatus and erasure correction decoding apparatus, the present invention is not limited to this and can be implemented using an electrical light communication apparatus.

Further, these encoding method and decoding method may be executed by software. For example, it is possible to store a program that executes the above encoding method and decoding method, in a ROM (Read Only Memory) and makes a CPU (Central Processor Unit) operate this program.

Further, it is equally possible to store a program that executes the above encoding method and decoding method, in a computer readable recording medium, records the program stored in the recording medium, in a RAM (Random Access Memory), and make the computer operate according to this program.

Furthermore, the present invention is not limited to wireless communication, and is useful for power line communication ("PLC"), visible light communication and optical communication.

One aspect of the encoding apparatus according to the present invention employs a configuration which includes: a padding section that adds a packet sequence that is known between an encoding side and a decoding side, to an information packet sequence; an interleaving section that reorders the packet sequence to which the known packet sequence is added; and a erasure correction coding section that performs packet erasure correction coding of the reordered packet sequence.

According to this configuration, the coding rate can be adjusted by adding a known packet sequence, and, by assigning known packets to positions which significantly influence the characteristics of erasure correction performance, erasure correction decoding can be performed after performing re-padding using known packets on the decoding side even in case where these known packets are lost on the communication channel, so that it is possible to suppress deterioration in error correction decoding performance in case where packets other than these known packets are lost.

One aspect of the encoding apparatus according to the present invention employs a configuration in which: the erasure correction coding section performs low density parity check coding.

According to this configuration, low density parity check coding is performed after interleaving, so that, by performing interleaving based on the characteristics of correction performance of the LDPC parity check matrix, it is possible to suppress deterioration in erasure correction decoding performance.

One aspect of the encoding apparatus according to the present invention employs a configuration in which: the interleaving section reorders the packet sequence to which the known packet sequence is added, such that the known packet corresponds to a position of a variable node forming a minimum stopping set in a parity check matrix that defines a low density parity check code.

According to this configuration, by changing the pattern of reordering information packets and known packets, to such a reordering pattern to avoid failure of erasure correction due to minimum stopping sets, it is possible to suppress deterioration in erasure correction decoding performance due to minimum stopping sets.

One aspect of the encoding apparatus according to the present invention employs a configuration in which: the interleaving section replaces the known packet with the information packet in a position corresponding to the variable node forming the minimum stopping set.

According to this configuration, known packets are assigned to positions corresponding to variable nodes forming a minimum stopping set in an LDPC parity check matrix, so that the decoding side can re-pad known packets even if these known packets are lost, and suppress deterioration in erasure correction decoding performance even in case where information packets other than known packets are lost.

One aspect of the encoding apparatus according to the present invention employs a configuration in which: the interleaving section preferentially assigns the known packet to a position corresponding to the variable node in order from a variable node included in a greater number of minimum stopping sets.

According to this configuration, in case where there are a plurality of minimum stopping sets, a known packet can be assigned preferentially to a position corresponding to a variable node that influences a greater number of minimum stopping sets, so that it is possible to reliably suppress deterioration in erasure correction decoding performance even in case where a small number of known packets are added.

One aspect of the encoding apparatus according to the present invention employs a configuration in which: the interleaving section assigns the known packet to at least one of positions corresponding to variable nodes forming the minimum stopping set.

According to this configuration, in case where there are a plurality of minimum stopping sets, a known packet is assigned to a position corresponding to at least one of variable nodes forming each minimum stopping set, so that, in case where there are a greater number of packets that are lost on a communication channel, the decoding side can re-pad a known packet to a position of at least one of variable nodes forming each minimum stopping set and it is possible to avoid failure of erasure correction due to minimum stopping sets.

One aspect of the encoding apparatus according to the present invention employs a configuration in which: the interleaving section reorders the packet sequence to which the known packet sequence is added, based on a column degree of a parity check matrix that defines a low density parity check code.

One aspect of the encoding apparatus according to the present invention employs a configuration in which: the interleaving section preferentially assigns the known packet to a position corresponding to the variable node in order from a variable node having a greater column degree.

According to this configuration, in case where a low density parity check code is irregular, by switching to such a reordering pattern to avoid failure of erasure correction due to erasure of a packet assigned to a variable node of the maximum column degree that relates to limitation of the characteristics of correction performance of the LDDC parity check matrix, it is possible to reduce deterioration in erasure correction decoding performance.

One aspect of the decoding apparatus according to the present invention employs a configuration in which: a re-padding section that re-pads a received packet sequence; a erasure correction decoding section that performs erasure correction decoding processing of the re-padded packet sequence; and a deinterleaving section that reorders the packet sequence subjected to the erasure correction decoding.

According to this configuration, the encoding side can adjust the coding rate by adding a known packet sequence, and assigns known packets to positions that influence the characteristics of erasure correction performance significantly, so that, even in case where these known packets are lost on a communication channel, the decoding side can re-pad the known packets and then perform erasure correction and, consequently, it is possible to suppress deterioration in erasure correction decoding performance in case where packets other than these known packets are lost.

One aspect of the decoding apparatus according to the present invention employs a configuration in which: the erasure correction decoding section performs iterative decoding of a low density parity check code.

According to this configuration, the encoding side performs interleaving based on the characteristics of correction performance of an LDPC parity check matrix, so that it is possible to suppress deterioration in erasure correction decoding performance.

One aspect of the decoding apparatus according to the present invention employs a configuration in which: the re-padding section re-pads a packet that is known between an encoding side and a decoding side, in ease where a packet in a position corresponding to a variable node forming a minimum stopping set in a parity check matrix that defines the low density parity check code is lost.

According to this configuration, in case where the encoding side assigns known packets to positions corresponding to variable nodes forming minimum stopping sets in the LDPC parity check matrix, the decoding side can re-pad known packets in case where these known packets are lost, so that it is possible to suppress deterioration in erasure correction decoding performance due to minimum stopping sets.

One aspect of the decoding apparatus according to the present invention employs a configuration in which the deinterleaving section performs reverse reordering processing of the reordering performed on the encoding side.

According to this configuration, it is possible to acquire an information packet sequence before it is subjected to interleaving on the encoding side.

One aspect of the decoding apparatus according to the present invention employs a configuration in which: the deinterleaving section exchanges a packet in a position corresponding to a variable node forming a minimum stopping set in a parity check matrix that defines the low density parity check code, with a packet in a position corresponding to a variable node other than the variable node forming the minimum stopping set.

According to this configuration, in case where known packets are assigned to positions corresponding to variable nodes forming minimum stopping sets and information packets are assigned to positions corresponding to these variable nodes, it is possible to acquire the information packet sequence before it is subjected to interleaving on the encoding side, by switching known packets and information packets.

One aspect of the decoding apparatus according to the present invention employs a configuration in which: the re-padding section re-pads a packet that is known between an encoding side and a decoding side, in case where a packet in a position corresponding to a variable node having a maximum column degree in a parity check matrix that defines the low density parity check code.

According to this configuration, in case where the encoding side assigns a known packet to the position corresponding to the variable node of the maximum column degree in the LDPC parity check matrix, even if this known packet is lost, the decoding side can re-pad the known packet, so that it is possible to suppress deterioration in erasure correction decoding performance.

One aspect of the encoding apparatus according to the present invention employs a configuration which includes: a erasure correction coding section that performs erasure correction coding of a packet sequence; an interleaving section that reorders the packet sequence subjected to erasure correction coding; and a puncturing section that punctures the interleaved packet sequence.

According to this configuration, it is possible to adjust the coding rate by means of puncturing and suppress deterioration in erasure correction decoding performance by reordering the packet sequence prior to puncturing such that the packet that influences erasure correction decoding performance little, is punctured.

One aspect of the encoding apparatus according to the present invention employs a configuration in which: the erasure correction coding section performs low density parity check coding.

According to this configuration, the encoding side can perform interleaving based on the characteristics of correction performance of the LDPC parity check matrix, so that it is possible to suppress deterioration in erasure correction decoding performance.

One aspect of the encoding apparatus according to the present invention employs a configuration in which the interleaving section preferentially assigns a packet which corresponds to the variable node, to a position to be punctured by the puncturing section, in order from a variable node included in a smaller number of minimum stopping sets in the parity check matrix that defines a low density parity check code.

According to this configuration, in case where there are a plurality of minimum stopping sets, packets are rearranged such that a packet in a position corresponding to a variable node that influences minimum stopping sets little is punctured preferentially, so that it is possible to suppress deterioration in erasure correction decoding performance due to minimum stopping sets.

One aspect of the decoding apparatus according to the present invention employs a configuration which includes: a depuncturing section that performs depuncturing processing of a packet sequence; a deinterleaving section that reorders the depunctured packet sequence; and a erasure correction decoding section that performs erasure correction decoding processing of the deinterleaved packet sequence.

According to this configuration, the encoding side punctures packets that influence erasure correction decoding performance little, so that it is possible to suppress deterioration in erasure decoding correction performance.

One aspect of the decoding apparatus according to the present invention employs a configuration in which the erasure correction decoding section performs iterative decoding of a low density parity check code.

According to this configuration, the encoding side performs reordering prior to puncturing processing such that packets in positions corresponding to variable nodes that influence the characteristics of correction performance of the LDPC parity check matrix little are punctured, so that it is possible to improve erasure correction decoding performance.

One aspect of the encoding apparatus according to the present invention employs a configuration which includes: an error correction coding section that performs error correction coding of a bit sequence; an interleaving section that reorders the bit sequence subjected to error correction coding; and a puncturing section that punctures the interleaved bit sequence.

According to this configuration, it is possible to adjust the coding rate by means of puncturing and suppress deterioration in error correction decoding performance by reordering the bit sequence prior to puncturing such that the bit that influences error correction decoding performance little, is punctured.

One aspect of the encoding apparatus according to the present invention employs a configuration in which: the error correction coding section performs low density parity check coding.

According to this configuration, the encoding side performs interleaving based on the characteristics of correction performance of the LDPC parity check matrix, so that it is possible to suppress deterioration in error correction performance.

One aspect of the encoding apparatus according to the present invention employs a configuration in which the interleaving section assigns a bit preferentially to a position to be punctured by the puncturing section, in order from a variable node included in a smaller number of minimum stopping sets in the parity check matrix that defines a low density parity check code.

According to this configuration, in case where there are a plurality of minimum stopping sets, bits are rearranged such that a bit in a position corresponding to a variable node that influences minimum stopping sets little is punctured preferentially, so that it is possible to suppress deterioration in erasure correction decoding performance due to minimum stopping sets.

One aspect of the decoding apparatus according to the present invention employs a configuration which includes: a depuncturing section that depunctures a bit sequence; a deinterleaving section that reorders the depunctured bit sequence; and an error correction decoding section that performs error correction decoding processing of the deinterleaved bit sequence.

According to this configuration, the encoding side punctures bits that influence erasure correction decoding performance little, so that it is possible to suppress deterioration in erasure decoding correction performance.

One aspect of the decoding apparatus according to the present invention employs a configuration in which the error correction decoding section performs iterative decoding of a low density parity check code.

According to this configuration, the encoding side performs reordering prior to puncturing processing, such that bits in positions corresponding to variable nodes that influence the characteristics of correction performance of the LDPC parity check matrix little are punctured, so that it is possible to improve error correction decoding performance.

The disclosures of Japanese Patent Application No. 2007-197939, filed on Jul. 30, 2007 and Japanese Patent Application No. 2008-193615, filed on Jul. 28, 2008, including the specifications, drawings and abstracts, are incorporated herein by reference in their entirety.

INDUSTRIAL APPLICABILITY

The present invention can effectively reduce the frequency of decoding failure in LDPC encoding/decoding, and is useful for an encoding apparatus and decoding apparatus for performing erasure correction by adding redundancy to information data using a low density parity check ("LDPC") code.

The invention claimed is:

1. An encoding apparatus comprising:
a padder that adds a packet sequence that is known between an encoding side and a decoding side, to an information packet sequence;
a memory that stores a packet sequence to which the known packet sequence is added;
an interleaver that reorders the packet sequence to which the known packet sequence is added, by reading the packet sequence, stored in the memory, to which the known packet sequence is added such that a known packet of the known packet sequence corresponds to a position of a variable node forming a minimum stopping set in a parity check matrix that defines a low density parity check node; and
an erasure correction encoder that performs packet erasure correction coding of the reordered packet sequence.

2. The encoding apparatus according to claim 1, wherein the erasure correction coder performs low density parity check coding.

3. The encoding apparatus according to claim 1, wherein the interleaver replaces the known packet with the information packet in a position corresponding to the variable node forming the minimum stopping set.

4. The encoding apparatus according to claim 1, wherein the interleaver preferentially assigns the known packet to a position corresponding to the variable node in order from a variable node included in a greater number of minimum stopping sets.

5. The encoding apparatus according to claim 1, wherein the interleaver assigns the known packet to at least one of positions corresponding to variable nodes forming the minimum stopping set.

6. A decoding apparatus comprising:
a re-padder that re-pads a packet of a packet sequence received at an encoding side and a decoding side, in case where a packet in a position corresponding to a variable node forming a minimum stopping set in a parity check matrix that defines the low density parity check code is lost;
an erasure correction decoder that performs erasure correction decoding of the re-padded packet sequence;
a memory that stores the packet sequence subjected to the erasure correction decoding; and
a deinterleaver that reorders the packet sequence subjected to the erasure correction decoding stored in the memory.

7. The decoding apparatus according to claim 6, wherein the erasure correction decoder performs iterative decoding of a low density parity check code.

8. The decoding apparatus according to claim 6, wherein the deinterleaver exchanges a packet in a position corresponding to a variable node forming a minimum stopping set in a parity check matrix that defines the low density parity check code, with a packet in a position corresponding to a variable node other than the variable node forming the minimum stopping set.

* * * * *